(12) United States Patent
Guilfoyle et al.

(10) Patent No.: US 6,959,027 B1
(45) Date of Patent: Oct. 25, 2005

(54) HIGH-POWER COHERENT ARRAYS OF VERTICAL CAVITY SURFACE EMITTING LASERS

(75) Inventors: Peter Guilfoyle, Zephyr Cove, NV (US); Gary S. Evans, Plano, TX (US); Cheng C. Ko, Carson City, NV (US)

(73) Assignee: Opticomp Corporation, Zephyr Cove, NV (US)

( * ) Notice: Subject to any disclaimer, the term of this patent is extended or adjusted under 35 U.S.C. 154(b) by 0 days.

(21) Appl. No.: 10/278,828

(22) Filed: Oct. 22, 2002
(Under 37 CFR 1.47)

Related U.S. Application Data

(63) Continuation of application No. 09/867,718, filed on May 29, 2001, now abandoned.

(60) Provisional application No. 60/207,540, filed on May 26, 2000.

(51) Int. Cl.[7] .............................................. H01S 5/00
(52) U.S. Cl. ............................ 372/50; 372/18; 372/19; 372/43; 372/44; 372/45; 372/46
(58) Field of Search ..................... 372/50, 18, 29.03, 372/108, 19, 43–46

(56) References Cited

U.S. PATENT DOCUMENTS

| | | | |
|---|---|---|---|
| 5,033,060 A | * | 7/1991 | Leger et al. .................. 372/97 |
| 6,031,243 A | * | 2/2000 | Taylor .......................... 257/13 |
| 2002/0196414 A1 | * | 12/2002 | Manni et al. ................. 353/31 |

OTHER PUBLICATIONS

J.R. Leger et al., Coherent addition of AlGaAs laser using microlenses and diffractive coupling, Applied Physics Letters, vol. 52, pp. 1771-1773, 1988.*

* cited by examiner

*Primary Examiner*—Don Wong
*Assistant Examiner*—Leith A. Al-Nazer
(74) *Attorney, Agent, or Firm*—DLA Piper Rudnick Gray Cary US LLP

(57) ABSTRACT

A high-power coherent array of Vertical Cavity Surface Emitter Lasers is described in which a plurality of Vertical Cavity Surface Emitting Lasers (VCSELs) are provided along with a structure which optically couples each of the VCSELs the plurality of VCSELs to one another by a predetermined amount to cause a coherent mode locking condition to occur. The coupling structure can be a beam cube, a plurality of smaller bean cubes, or a waveguide/grating system, for example. A reference source, or controlled coupling among the VCSELs, is used to phase lock the VCSELs to one another.

25 Claims, 20 Drawing Sheets

| Al Mole Fraction ($Al_xGa_{1-x}As$) | Refractive Index |
|---|---|
| 0 | 3.667893 |
| 0.15 | 3.5101468 |
| 0.2 | 3.476555 |
| 0.3 | 3.4165098 |
| 0.4 | 3.3601311 |

HIGH-POWER COHERENT ARRAYS OF VERTICAL CAVITY SURFACE EMITTING LASERS

RELATED APPLICATIONS

The present application is a continuation of application Ser. No. 09/867,718, filed May 29, 2001, now abandoned, claims priority under 35 U.S.C. § 119(e) from provisional application Ser. No. 60/207,540, filed May 26, 2000.

TECHNICAL FIELD

The present invention is directed generally to a method and apparatus for generating high-power coherent light; and more particularly to a method and apparatus for generating high-power coherent light from arrays of vertical cavity surface emitting lasers (VCSELs).

BACKGROUND ART

VCSEL arrays can be used as low-cost, high-power light sources for a variety of military and commercial applications. Currently, the cost of high power (500 to 1000 W) Nd:YAG and $CO_2$ lasers exceed $100/Watt. Coherent VCSEL arrays have been realized in the premises network market where low power (<0.005 W), VCSEL based transceivers selling for ~$100 dominate the market, having displaced edge-emitting semiconductor laser based transceivers that sell in the $500 to $5000 range.

Other applications, such as optical pumps at 980 nm for Erbium-doped fiber amplifiers (EDFAs) for telecommunications will benefit from low cost lasers with increased power (0.05 to 1.0 W). High-powered EDFAs cannot be achieved from single element VCSELs, but could be economically fabricated with VCSEL arrays. VCSEL arrays are theoretically capable of kW of power with current material and heat sinking technology.

Aside from these commercial and economic applications, coherent arrays of VCSELs have far-reaching significance because they have the potential to deliver >>1 W of power, over a wide variety of wavelengths. These devices can be used to accelerate progress in areas such as medicine, communications, manufacturing, and national defense.

High-power VCSEL arrays have been demonstrated by several research groups. Grabherr et al. reported VCSEL power densities exceeding 300 W/cm 2 from a 23-element array [M. Grabherr et. al., Electron. Lett., vol. 34, p. 1227, 1998]. Francis et al. demonstrated VCSEL power in excess of 2-W continuous wave and 5 W pulsed from a 1000-element VCSEL array [D. Francis, et. al., IEEE Int. Semiconductor Laser Conf. (ISLC), Nara, Japan, October 1998]. Chen et al. also reported the power density of 10 kW/cm 2 from an array of 1600 VCSELs using a microlens array to individually collimate light from each laser [H. Chen, et. al., IEEE Photon. Technol. Lett., vol. 11, No. 5, p. 506, May 1999]. However, their beam quality at high power is still poor. A high quality beam requires a narrow linewidth single mode with high spatial and temporal coherence.

In order to produce coherent, single-frequency, high-power arrays of VCSELs, the elements of one or two-dimensional VCSEL arrays should be phase-locked. Although the light from each individual VCSEL is coherent, the phase and frequencies (or wavelengths) of the light from each VCSEL are slightly different, and therefore uncorrelated. For such an incoherent array consisting of N elements producing the same power P, the on-axis power in the far-field is ~NP. However, if the array can be made coherent, in phase, and with a single frequency, the on-axis power in the far-field is $N^2P$ and the width of the radiation pattern is reduced by ~1/N. This high on-axis far-field power is required in laser applications such as free space optical communications and laser radar where a large amount of power is required at a distance, or in applications such as laser welding, laser machining, and optical fiber coupling that require high power to be focused to a small spot.

Previous efforts to phase-lock arrays of VCSELs have used diffraction coupling [J. R. Legar, et. al., Appl. Phys. Lett., vol. 52, p. 1771, 1988] and evanescent coupling [H. J. Yoo, et. al., Appl. Phys. Lett., vol. 56, p. 1198, 1990]. Diffraction coupling depends on geometrical scattering of light and evanescent coupling requires that the optical field of adjacent array elements overlap. Both approaches impose restrictions on the array architecture. More importantly, these existing approaches have had very limited success, even in 1D edge-emitting arrays where both approaches have been extensively investigated. Recently, Choquette et al. has demonstrated phase locking in a VCSEL array using an anti-guide approach [D. K. Serkland, et. al., IEEE LEOS Summer Topical Meeting, p. 267, 1999].

BRIEF SUMMARY OF THE INVENTION

The foregoing and other problems and disadvantages of previous attempts to provide a high-power coherent source of light are overcome by the present invention of a high-power coherent array of vertical cavity surface emitting lasers. In accordance with the present invention, a plurality of Vertical Cavity Surface Emitting Lasers (VCSELs) are provided; along with a structure which optically couples each of the VCSELs the plurality of VCSELs to one another by a predetermined amount to cause a coherent mode locking condition to occur. The coupling structure can be a beam cube.

More particularly, the beam cube is positioned to couple light from a reference source of light into the plurality of VCSELs with a vertically dependent phase, and to provide a predetermined amount of coupling between the plurality of VCSELs to cause a coherent mode locking condition to occur. Preferably, the light from the reference source which is coupled by the beam cube to the plurality of VCSELs has a phase difference between ones of the plurality of VCSELs which is substantially equal to an integer multiple of $2\pi$ radians.

In one embodiment of the present invention, VCSEL/waveguide grating system for realizing high-power coherent arrays of VCSELs is provided to achieve phase locking through a waveguide with grating couplers. Coupling into and out of a waveguide using a grating is a simple method to transfer free space data to waveguides in optoelectronic integrated circuits (OEICs). Waveguide gratings can perform a large variety of functions such as reflection, filtering, deflection, and input/output coupling. A periodically modulated grating can perform holographic-wavefront conversion. As a coupler, the grating converts a waveguide mode into a radiation mode, or vice versa. Surface-normal grating couplers direct light perpendicularly into and out of the waveguide. With the advance in VCSEL technology, the use of such diffraction grating becomes an interesting mechanism to create high-power coherent light sources.

The approach of the waveguide/grating embodiment of the present invention to achieve high-power coherent lasers is based on the use of a periodic grating in a common connecting waveguide to provide optical coupling between the array elements. FIG. 1(c) shows a simplified VCSEL/ waveguide structure. Each element of the array is a small optical oscillator (laser) which is defined by a pair of distributed Bragg reflector (DBR) mirrors. Each pair of DBR mirrors provides feedback to a multiple quantum well gain region, causing oscillation. Electrons and holes in the gain region produce light when current is injected into the device.

Unlike previous phase locking approaches, the distribution waveguide method of the present invention can provide phase locking by controlling a precise amount of coupling between array elements independent of the element size and element spacing. A bulk beam cube, a collection of smaller distributed beam cubes, or gratings formed along the optical path, or the like, provide waveguides which collect and distribute light from/to the VCSELs, and through controlled coupling, provide a phase locking of the VCSELs.

In the coupled waveguide approach of the present invention, there is provided a linear array of elements which can be extended into a 2D array. Another major advantage of this approach is that phase adjusters can be included to assist in beam-forming and electronic beam steering. In the simplest implementation, the phase adjusters could be a VCSEL element operated below lasing threshold, where variations in current correspond to refractive index changes in the gain regions causing a change in the effective optical length of the element. This approach brings the proven technological and economic benefits demonstrated by combining transistors, capacitors, and resistors into large scale integrated circuits to integrated photonic circuits consisting of lasers, optical waveguides, and grating or other couplers.

These and other features and advantages of the present invention will be more readily understood upon consideration of the following detailed description of various embodiments of the present invention, and accompanying drawings.

BRIEF DESCRIPTION OF THE DRAWINGS

FIGS. 9(a) to 9(g) show the optical confinement factor of the four-layer waveguide which is shown in FIG. 8(a) for different cladding layer thickness $d_2$ (layer 2) of 1.5 $\mu$m and 2.0 $\mu$m, in accordance with the present invention, where FIG. 9(g) is a Table of the refractive index values used for FIGS. 9(a) to 9(f).

DETAILED DESCRIPTION OF THE INVENTION

Figure 1A:
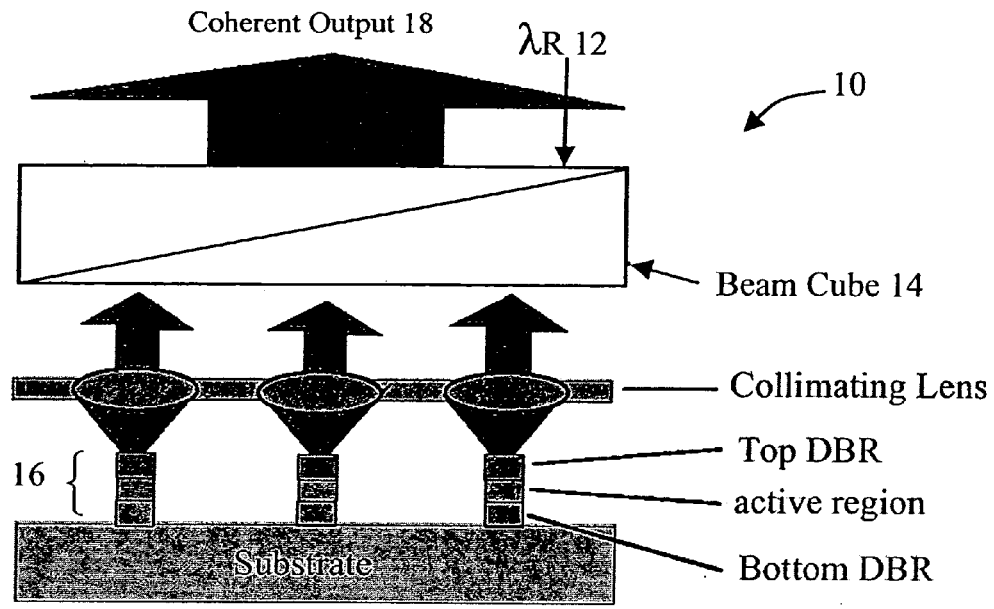
FIGS. 1(a), 1(b), 1(c) and 1(d) are simplified illustrations of a VCSEL array and waveguide structures where light from each VCSEL is coupled into the waveguide, in accordance with the present invention.

In accordance with the present invention, FIG. 1(a) illustrates a high power coherent source 10 in which a collimated reference beam 12 is passed through a beam cube 14 and illuminates an array of VCSELs 16. The beam cube 14 is designed so that the optical power coupled into each element of the VCSEL array 16 is sufficiently large such that the VCSELs will be coherently locked to the reference source 12. A vertically dependent phase is introduced to the reference beam 12 as it is passed through the beam cube 14. In order for all the VCSEL elements in the array to have the same phase and add up coherently to form a high power source, the phase difference of the reference beam between any two elements in the array should be close to a multiple of $2\pi$ radians. In order to achieve this phase front for the reference beam 12, the beam cube 14 can be rotated. The coherently summed optical outputs 18 from the VCSEL array 16 are reflected away from the reference source by the beam cube 14.

Figure 1B:
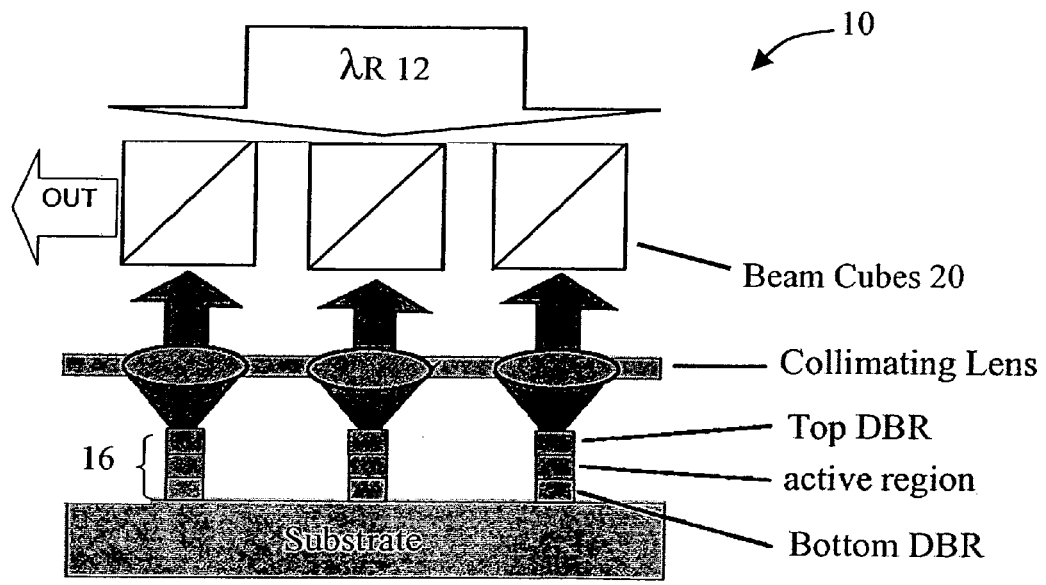

In another embodiment of the present invention, shown in FIG. 1(b), the bulk beam cube 14 can be replaced by many smaller beam cubes 20, where a small beam cube 20 is associated with each element in the VCSEL array 16.

While the embodiments of FIGS. 1(a) and 1(b) are described in terms of phase adjustments, the time domain phase adjustment function of the beam cubes can instead be implemented in the frequency domain. A frequency domain implementation of phase adjustment can be realized by taking the Fourier Transform of the beam cubes 20. In the time domain, the beam cubes 20 create phase differences across the reference beam 12 by introducing optical path length differences, which can be adjusted by rotating the beam cubes. In the frequency domain, this is equivalent to a sinusoidal where the phase relationships are adjusted by changing the period of the sinusoidal.

Figure 1C:
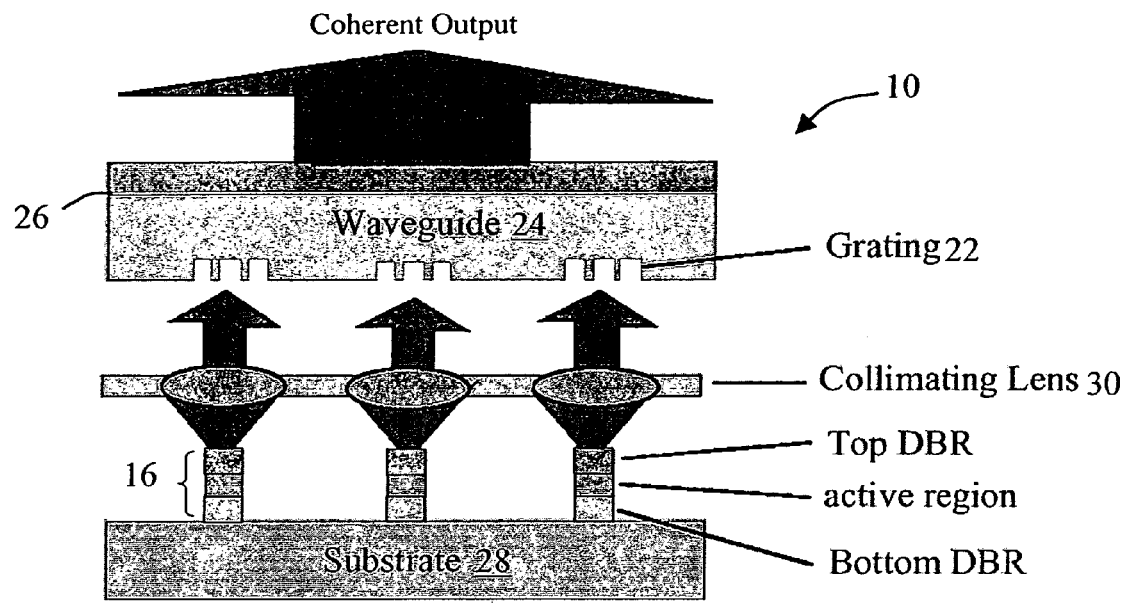

An implementation of the above sinusoidal in the frequency domain can be accomplished by the use of surface gratings 22 on waveguides 24, as shown in FIG. 1(c). These surface gratings 22 can be fabricated by etching or implantation, for example.

Therefore, in accordance with the present invention, a periodic grating is used to implement frequency domain phase adjustment for coherent coupling and mode locking in a VCSEL array.

One difference to be noted between the embodiments of FIGS. 1(a) and 1(b) is that the reference beam 12 which was used to coherently mode lock the VCSELs in those embodiments, is replaced by coherent coupling and mode locking between the VCSEL elements in the array. This is accomplished by coupling part of a VCSEL's output power to a waveguide by the grating structure 22 and coupling part of that power to other VCSELs in the array 16, thereby forcing all the VCSELs in the array to become mutually coherent. This enables the all the VCSEL outputs to be coherently summed for the purpose of obtaining a high power source. In this implementation, the coherent output of the VCSEL array 16 will be in the same direction as the VCSEL outputs and the waveguide 24 with the surface grating 22 is fabricated on a substrate 26 which is different from the substrate 28 on which the VCSELs are fabricated. Collimating optics 30 may be included in this implementation to improve coupling to the waveguides 24 by the surface gratings 22.

Figure 1D:
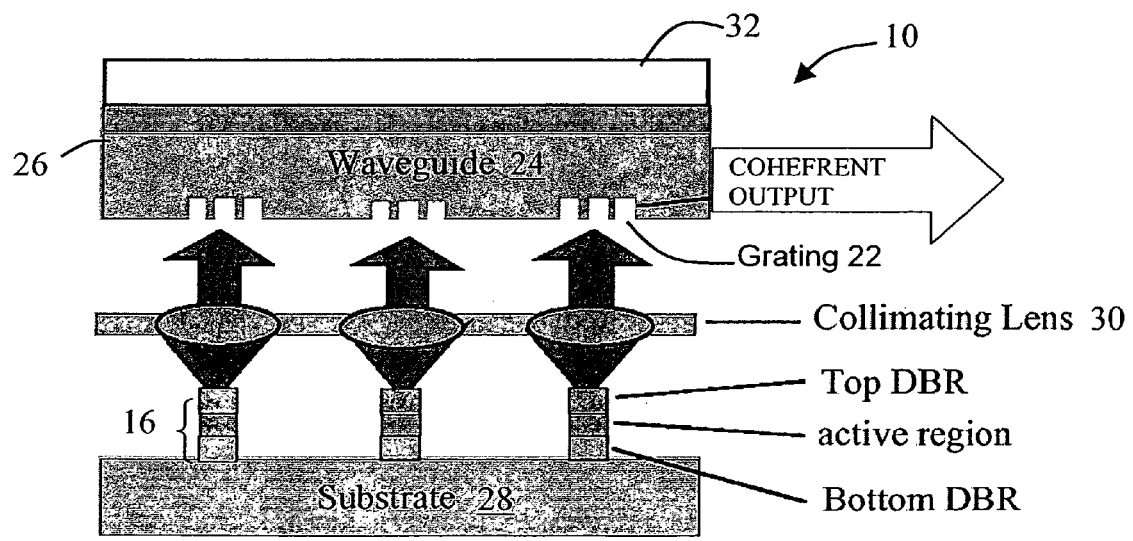

FIG. 1(d) illustrates an alternative implementation of the embodiment of FIG. 1(c), which involves placing a highly reflective mirror 32 on the waveguide substrate 26 to reflect light transmitted through the waveguide grating 22 back through the waveguide grating 22. This implementation will allow the high power coherent output of the VCSEL array to be coupled to the waveguide, resulting in a high power coherent source in a normal to that of the apparatus in FIG. 1(c).

Figure 3:
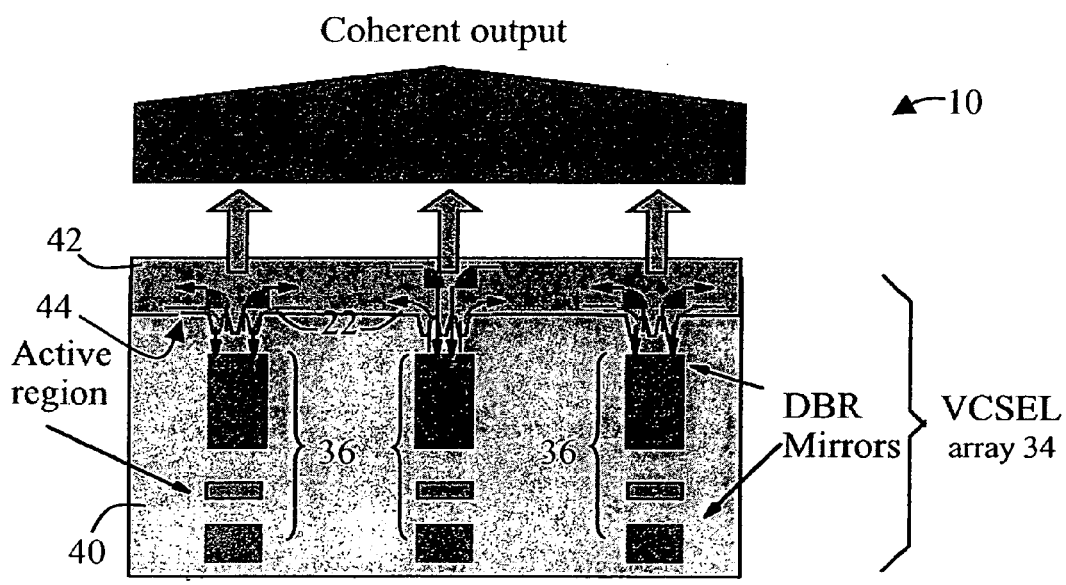
FIG. 3 is a schematic illustration of a monolithic VCSEL/ waveguide structure with a top waveguide grating coupler, in accordance with the present invention.
Figure 4:
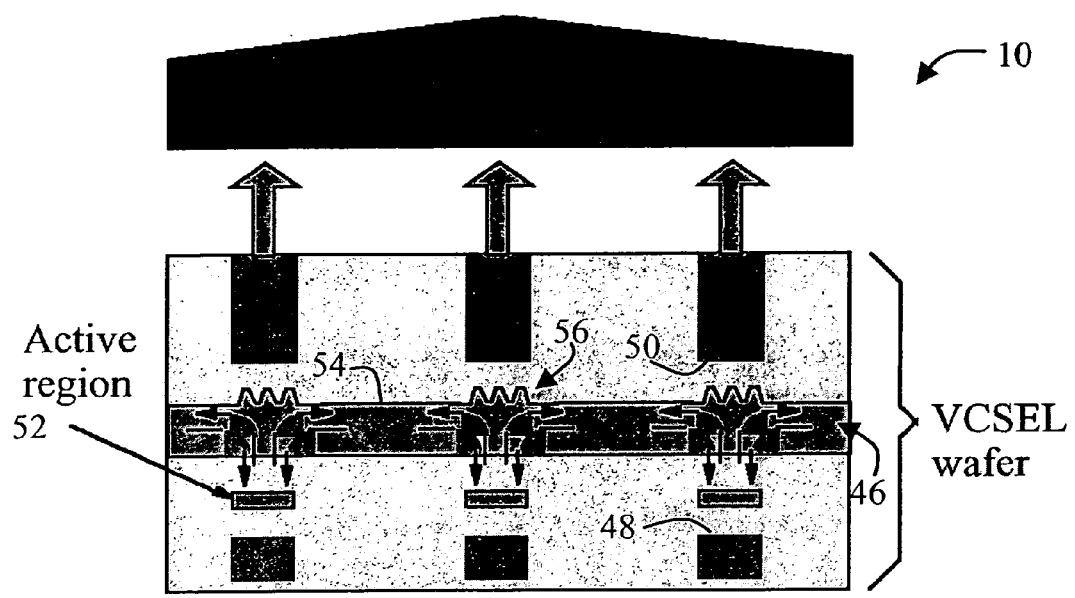
FIG. 4 is a simplified schematic of a monolithic VCSEL/ waveguide structure with an internal grating coupler, in accordance with the present invention.

The embodiment of FIG. 1(c) can be fabricated in a monolithic structure on a single substrate, so that the VCSEL array 16, waveguides 24, and gratings 22 are all formed on one substrate, for example, as shown in FIGS. 3 and 4. This implementation doesn't require any collimating optics 30 and may or may not include mirror 32 as in FIG. 1(d) to create a structure with the high power coherent output in the plane of the substrate.

A variation to be noted between the monolithic embodiments of FIGS. 3 and 4 is that in FIG. 4, the waveguides 24 and gratings 22 are placed within one of the VCSELs' mirrors (DBRs). The thickness of the waveguide layer 24 is such that it functions as a high index layer of the DBR.

The surface-normal waveguide grating coupler embodiment of the present invention, FIGS. 1(d), 2, 3, and 4, will now be described in greater detail.

A surface-normal waveguide grating coupler has been developed to achieve coherent high-power light sources. Three approaches will be described to integrate the grating-coupled waveguide with the VCSEL array: (1) a hybrid VCSEL/waveguide structure, (2) a monolithic VCSEL/waveguide structure with a top waveguide grating coupler, and (3) a monolithic VCSEL/waveguide structure with an internal waveguide grating coupler.

Any architecture that attempts to combine individual semiconductor lasers into a coherent array must address several issues:

1) The coupling must achieve coherence.
2) The phase of the coupling between elements needs to be stabilized.
3) The phases should add constructively ("in phase") for maximum on-axis power.
4) The emitting surface needs to be flat within a fraction of a wavelength.

The phase of the coupling is determined by 1) the DBR mirrors; 2) the spacings of all the epitaxial layers; and 3) the index changes of the optical paths due to injected current. This latter mechanism contributes detrimentally to the phase control of existing semiconductor laser arrays since all existing large arrays have individual elements that are electrically connected. As a result, instabilities between the photon densities and injected current in each element are impossible to control. Although individual current control to each element may be cumbersome and undesirable, with the VCSEL geometry, it is possible to use a patterned submount [G. A. Evans and J. M. Hammer, editors, Surface Emitting Semiconductor Lasers, Academic Press, New York, 1993] to individually control the current to each element. Further, instead of directly controlling the current to each array element, the overall complexity can be reduced and the desired amount of phase control still achieved by independently controlling of groups of subarrays of the VCSELs. The phase change due to gain-induced index variations may be exploited to maintain the array in the "in phase" mode.

In principle, with additional care in matching the lattice structure of the epilayers, the surface of the array can be made optically flat. In this variation, the ends of the common waveguide can have high reflectivity coatings and the coherent array emission can be emitted through one of the wafer surfaces. Such surface emission could be from either the VCSEL surface or through a transparent substrate. The naturally occurring surface emission (due to the second-order grating coupling light out of the common waveguide and the undeflected light generated by the VCSELs) can be enhanced with the addition of an anti-reflective coating (in the case of emission through a transparent substrate) and possibly an additional outcoupling grating.

Hybrid VCSEL/Waveguide Structure

Figure 2:
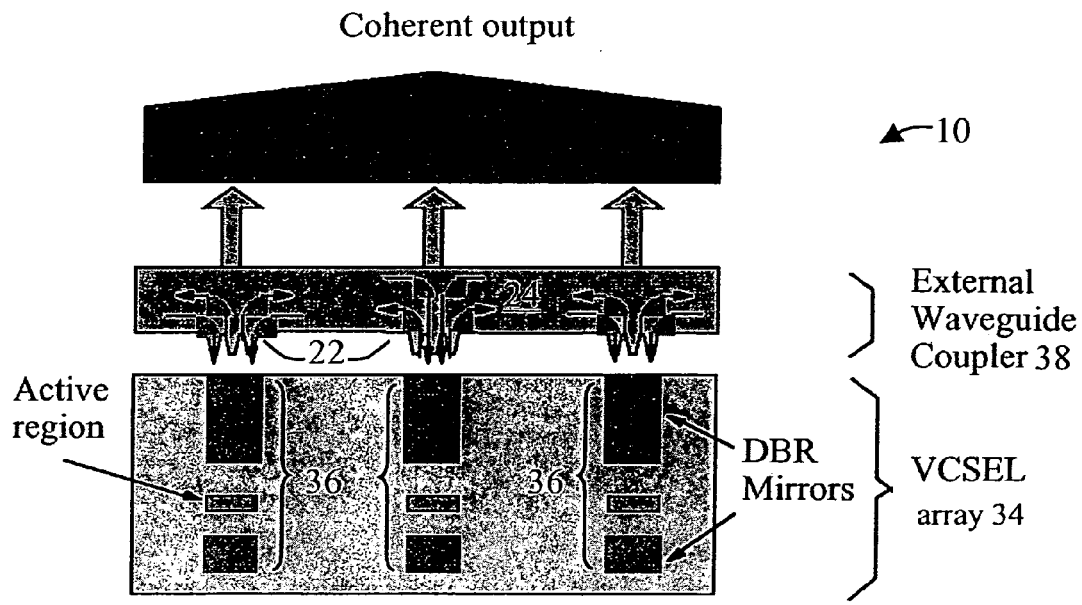
FIG. 2 is a schematic drawing of a hybrid VCSEL/ waveguide structure which includes a VCSEL array and a single common waveguide with a periodic grating, in accordance with the present invention.

FIG. 2 shows a schematic drawing of a hybrid VCSEL/waveguide structure which includes a VCSEL array 34 and a single common waveguide 24 with a periodic grating 22, labeled external waveguide coupler 38. The waveguide 24 is attached to the VCSEL array 34 through mechanical spacers (not shown). Optical coupling between the array elements 34 is provided by the grating coupled waveguide 34. An optical waveguide 24 with a series of gratings 22 allows the distribution and coupling of light into and out of individual VCSEL elements 36, thereby locking each element into a coherent, single frequency array mode.

Light from each VCSEL 36 is coupled by the grating coupler 38 and diffracted equally to the left and to the right of each grating 22. The grating coupler 38 is designed to separate first-order modes and couple these modes into the waveguide 24. The waveguide 24 allows the light to travel in either direction.

The first-order diffracted light can be transmitted through the grating 22 and reflected back from the grating 22. The light can be also coupled back into the VCSELs 36 for phase locking.

As mentioned previously, phase locking can be achieved using the distribution waveguide method by controlling a precise amount of coupling between array elements. This approach is independent of the element size and element spacing. The amount of coupling for phase locking is dependent on the VCSEL element diameter, grating depth, waveguide dimensions, and material compositions. It is estimated that ~1% of the single pass optical power in the common waveguide can be coupled into each VCSEL element, which is sufficient for phase locking. The grating coupled waveguide provides a linear array of elements which can be extended into a 2D array to produce high-power coherent arrays of VCSELs.

Monolithic VCSEL/Waveguide Structure with Top Waveguide Grating Coupler

Referring to FIG. 3, high-power coherent arrays of VCSELs can be achieved using a monolithic VCSEL/waveguide structure which is shown there.

A common waveguide 42 with grating couplers 22 is placed above the VCSELs 36 for coupling the output light from the VCSEL array.

For this approach, a VCSEL epitaxial structure 40 is first grown using standard growth techniques such as molecular beam epitaxy (MBE) or metalorganic chemical beam epitaxy (MOCVD). An additional layer 42 is grown on top of the VCSEL structure for the waveguide grating coupler. The coupling waveguide surface 44 is holographically exposed and the resulting photoresist grating is etched into the exposed wafer surface 44. The grating period required to couple the waveguide light into the VCSEL elements $\Lambda$ is typically ~0.25 $\mu$m. It is calculated from $\Lambda = \lambda_o / \eta_{eff}$, where $\lambda_o$ is the free space wavelength of the laser and $\eta_{eff}$ is the effective refractive index of the coupling waveguide.

Finally, the waveguide layer is epitaxially grown using a regrowth technique.

This approach avoids introducing complexity and losses into the basic VCSEL elements, and allows testing the VCSEL elements on a portion of the wafer before the waveguide and grating is fabricated. After the grating fabrication is complete, the remainder of the waveguide is epitaxially grown, where standard n- and p-side metals are applied prior to wafer testing.

Monolithic VCSEL/Waveguide Structure with Internal Waveguide Grating Coupler

FIG. 4 shows a schematic of a monolithic VCSEL/waveguide structure with an internal grating coupler 46. The coupling waveguide 46 is integrated between the two DBR mirrors 48, 50. To fabricate this structure, the first bottom DBR mirror 48, active region 52, and part of the coupling waveguide (up to the grating surface 54) is grown. The grating 56 is then fabricated. The top DBR mirror 50 of the VCSEL structure is then grown.

One of the potential challenges associated with the monolithic VCSEL/waveguide structure of FIG. 4, is the requirement of epitaxial regrowth. Regrowth of epitaxial structures is routinely performed for long-wavelength semiconductor lasers with a buried heterostructure design [Besomi, Wilson, Brown, Dutta, and Nelson, Electron. Lett., Vol. 20, pp. 417–8, 1984]. For short-wavelength semiconductor lasers, the presence of AlGaAs layers has limited the use of epitaxial re-growth.

The problem is that Al is very reactive and surface oxides can easily form when the sample is exposed to air. This surface oxide is very difficult to remove and in-situ etching is often required prior to regrowth on the AlGaAs interface [Mui, Strand, Thibeault, Coldren, Int. Symp. on Compound Semiconductor, San Diego, Calif., paper no. TUA4.8, 1994].

Another concern with regrowth on the grating coupler is whether the surface would planarize enough to allow for high quality DBR mirrors on top of the grating. As a safety pre-caution, the active region of the VCSEL structure are grown prior to the definition of the grating. It has been found that MOCVD is the best technique to perform a regrowth on the grating coupler 46 in order to ensure a planarized surface. Depending on the depth of the grating coupler 46, planarization should occur within 0.5 $\mu$m of the regrowth material.

Figure 5:
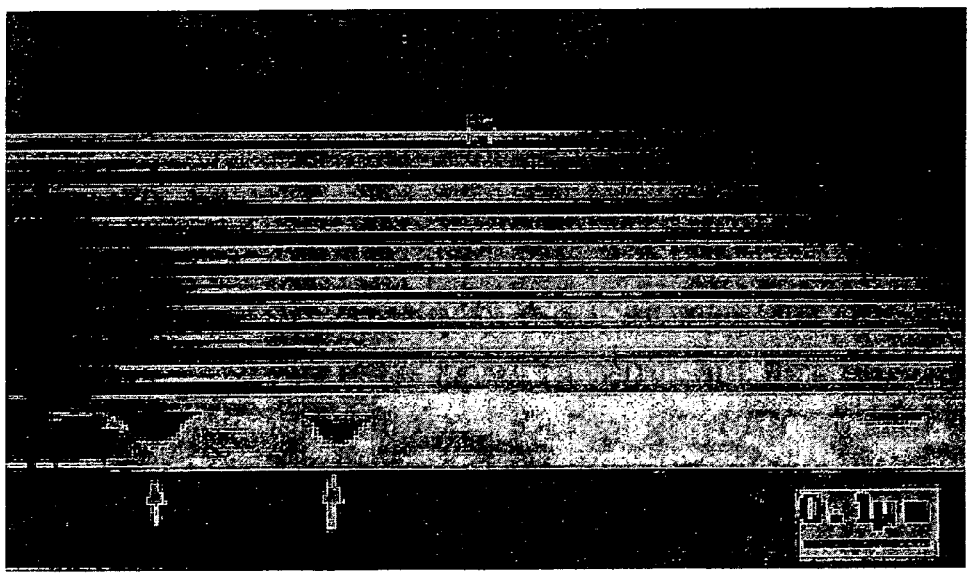
FIG. 5 is a transmission electron microscope (TEM) image showing the smoothing effects of a GaAs/AlGaAs superlattice growth using MOCVD.

FIG. 5 is a transmission electron microscope (TEM) image showing the smoothing effects of a GaAs/AlGaAs superlattice growth using MOCVD [Xu, Huang, Ren, and Jiang, Appl. Phys. Lett., Vol. 64, pp. 2949–51, 1994]. The TEM images indicate that the surface roughness (~0.1 $\mu$m height) was planarized within a few superlattice periods. In the case of the grating couplers, the grating depth is on the order of 50 nm; therefore, it is believed that the DBR mirrors grown on top of the grating coupler would be quite smooth.

Waveguide Grating Coupler

The waveguide grating coupler is a key component of the VCSEL/waveguide grating system.

The performance of the system depends largely on the grating coupler. It is of considerable interest to develop predictions of the efficiency of the diffraction process in terms of the waveguide and grating parameters. The coupling efficiency of a grating coupler is dependent on several parameters such as the grating depth, the index modulation of the grating, and the type of grating.

Several theoretical models have been developed to calculate the waveguide-grating interactions in terms of the tooth profile, composition, and position of the grating with respect to the optical waveguide. One model uses a modal formulation based on a Floquet-Bloch approach [Hadjicostas, et. el., IEEE JQE, Vol. 26, No. 5, p. 893, May 1990]. An-other model relies on a boundary element method [Evans, et. al., IEEE JQE, Vol. 27, No. 6, p. 1594, June 1991] and allows analysis of arbitrary grating profiles. The predictions of the Floquet-Bloch model have been compared to a complete, self-consistent experimental measurement of the wavelength dependence of reflection, transmission, and out-coupling from a Bragg second-order grating. Comparisons were made with the calculations for 50% duty cycle square-wave gratings with tooth depths equal to the experimentally measured values ranging from 40 nm to 600 nm. Close agreement between the theoretical and experimental results were obtained [Ayekavadi, et. al., SPIE meeting, Los Angeles, January 1991].

Figure 6:
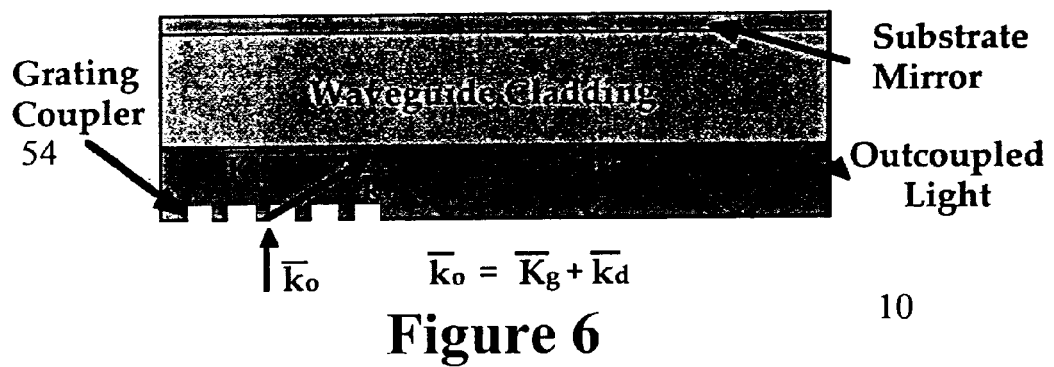
FIG. 6 presents a schematic of the waveguide grating coupler embedded in the waveguide core layer; $K_0$, $K_d$, are the wave vectors of an incoming free space beam, and diffracted wave, and the $K_g$ is a grating vector.

FIG. 6 shows a schematic drawing of a waveguide structure where the VCSEL light is coupled through the surface-normal second-order grating coupler 54. The phase matching condition dictates that the difference between the wavevector of the incident beam and the wavevector of the diffracted beam has to be conserved through the wavevector of the surface grating. As a result of the phase matching condition, the grating period, Λ for the surface normal grating coupler is chosen to be Λ32 $\lambda_o/\eta_{eff}$, where $\lambda_o$ is the wavelength of the incident light and n eff is the effective index of the guided mode [Gary A. Evans and J. M. Hammer, "Surface Emitting Semiconductor Lasers and Arrays", Academic Press, 1993].

Waveguide Grating Design

Figure 7:
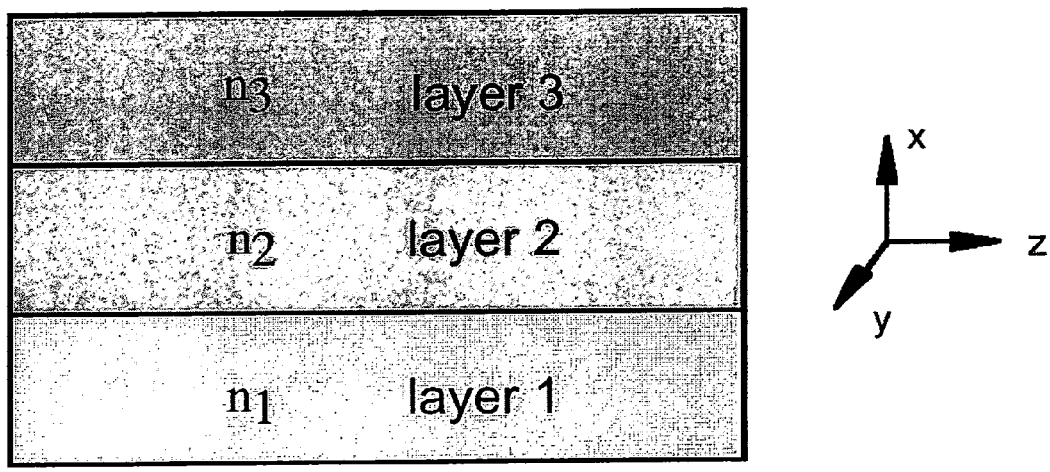
FIG. 7 shows a typical three-layer waveguide.

A typical three-layer waveguide is shown in FIG. 7. Layer 2 is the waveguide core and layers 1 and 3 are the cladding layers. $n_i$ is the refractive index of layer i. Two different waveguide structures were initially examined; asymmetric and symmetric. An asymmetric waveguide has different refractive indices in the cladding layers ($n_1 \neq n_3$), while the refractive indices in the cladding layers are the same in a symmetric waveguide ($n_1 = n_3$). However, an asymmetric waveguide structure was chosen for this program. It was found from the design process that a symmetric waveguide has several disadvantages over an asymmetric waveguide structure. These include the requirement of an extra epitaxial layer growth and a low optical coupling efficiency due to low index difference at the grating interface.

The waveguides are designed for both singlemode and multimode operations. The number of modes in the waveguide is dependent on the thickness of the waveguide core layer as well as the index difference between the waveguide and cladding layers.

Figures 8A, 8B:
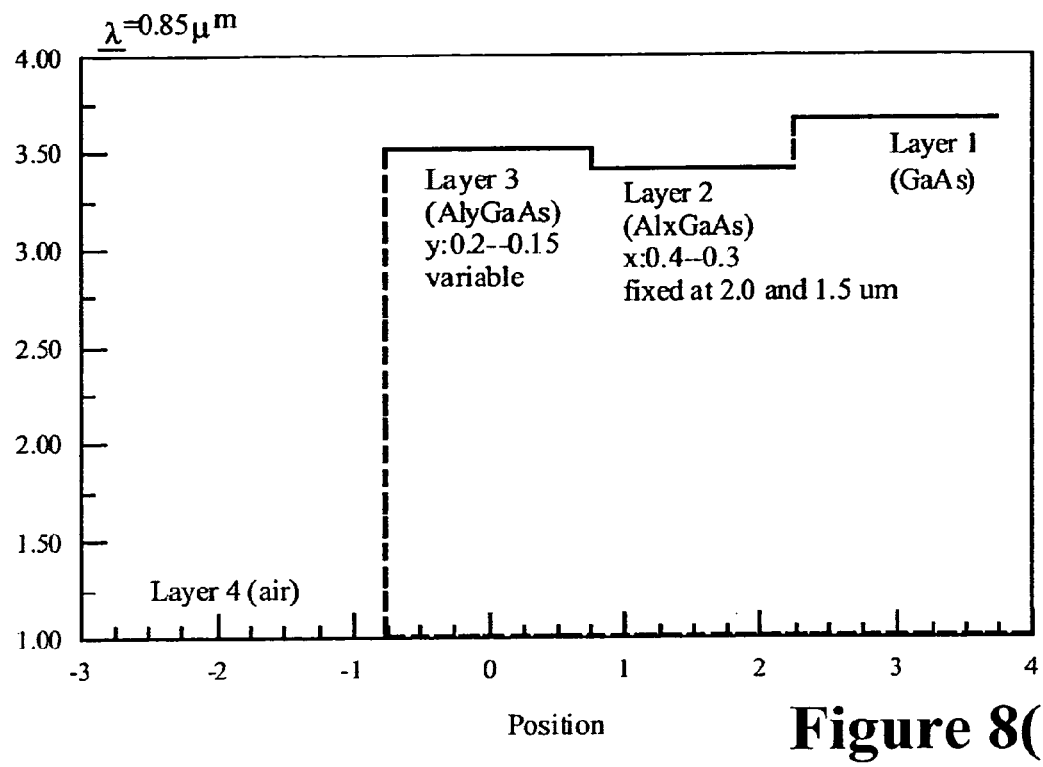
FIGS. 8(a) and 8(b) show a refractive index profile of an asymmetric waveguide structure which consists of four layers, and the refractive index values used for the four layers, in accordance with the present invention.

FIG. 8(a) shows a refractive index profile of an asymmetric waveguide structure which consists of four layers. Layer 1 is the GaAs substrate; layer 2 is the AlGaAs cladding layer; layer 3 is the AlGaAs waveguide core layer; and layer 4 is the air. The thicknesses and compositions of layers 2 and 3 should be determined to satisfy the operational requirements of the waveguide such as operational wavelength and the modal property.

Since a majority of the light will be guided in layers 2 and 3, these layers must be transparent at the VCSEL emission wavelength of 850 nm. This requirement is satisfied if the mole fraction of Al is greater than ~5%. The thicknesses of layers 2 and 3 should be designed such that the optical fields are not influenced at the interface between layer 1 and layer 2. In addition, for the wave to be guided, the refractive index of the waveguide core should be greater than that of the cladding layers, layers 2 and 4.

The thicknesses and compositions of layers 2 and 3 are also determined by considering the number of modes in the waveguide. If the refractive index step is too large, layer 3 will have to be very thin to remain singlemode. If the refractive index step is too small, the light will be loosely confined to layer 3 requiring that layer 2 be very thick so that the light is isolated from the lossy GaAs substrate (layer 1). To meet all of these constraints, the composition of layer 3 was chosen to have a mole fraction y of Al between 0.15 and 0.2 and the mole fraction x of Al in layer 2 to be between 0.3 and 0.4.

A complete solution of the field configuration (modes) for the four-layer waveguide which is shown in FIG. 4 were obtained by solving the wave equations derived from Maxwell's equations with proper boundary conditions at the interfaces. Several important parameters were calculated from the analysis such as the optical confinement factor and the effective refractive index.

These parameters were used in designing the waveguide and grating structures for optimal performance.

For example, the real and imaginary parts of the effective refractive index were used to determine the grating period and the mode structure, respectively. The confinement factor and the effective refractive index have a strong dependence on the waveguide layer thicknesses and their index differences. Therefore, it is very important to consider these parameters in the design of waveguide and grating.

The optical confinement factor is defined as the ratio of the optical power in a layer to the total mode power. The confinement factor for the ith layer, $\Gamma_i$ is given by $$\Gamma_i = \frac{\int_i |E(x)|^2 dx}{\int_{-\infty}^{+\infty} |E(x)|^2 dx} \quad (1)$$

where E(x) is the transverse field distribution in the waveguide structure and the integral in the numerator is performed over the width of the ith layer region. Since the coupling efficiency of the grating coupler is related to the field at the grating region, it is important to consider the field distribution in order to determine the fraction of the optical power within the grating layer. The grating layer will be etched into layer 3.

FIG. 9 shows the optical confinement factor of the four-layer waveguide which is shown in FIG. 8(a) for different cladding layer thickness $d_2$ (layer 2) of 1.5 μm and 2.0 μm.

The confinement factor in each layer is illustrated as a function of the waveguide core thickness $d_3$ Layer 2 has an Al mole fraction of either 0.3 or 0.4 and layer 3 has an Al mole fraction of either 0.15 or 0.2. The Table of FIG. 8(c) shows the refractive index values, at a wavelength of 0.85 μm used in this calculation.

Figure 9A:
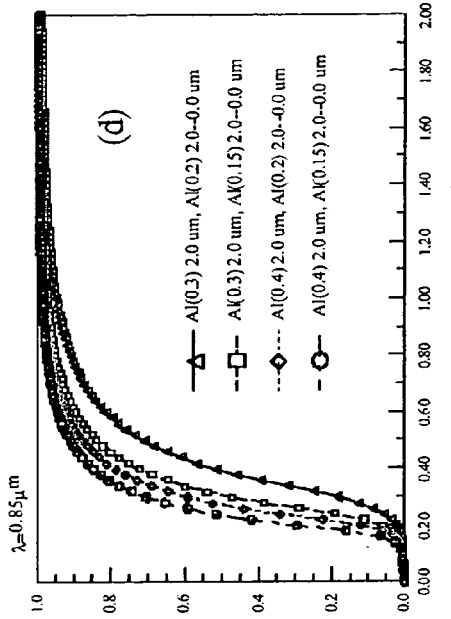
Figure 9B:
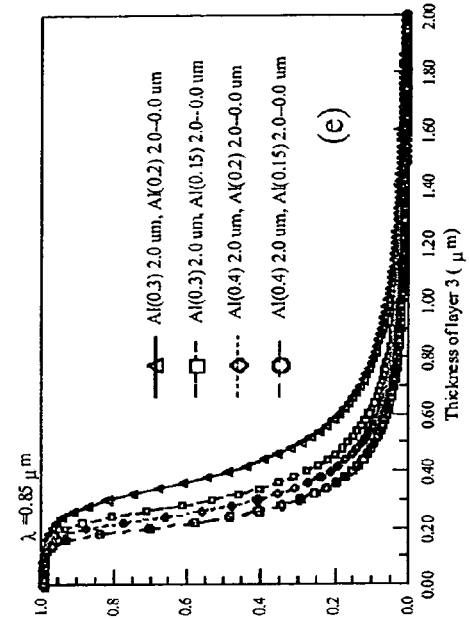
Figure 9D:
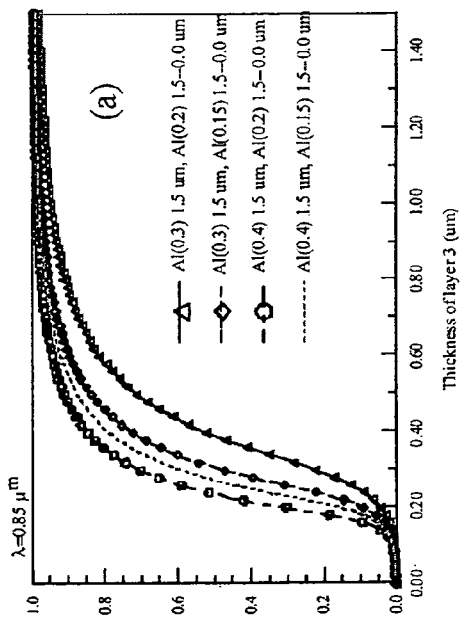
Figure 9E:
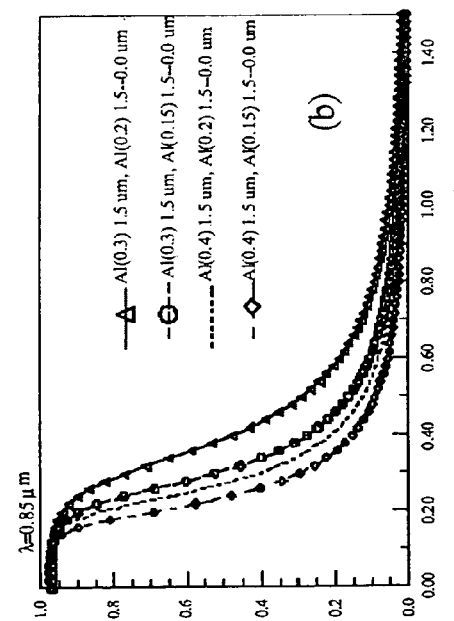
Figure 9F:
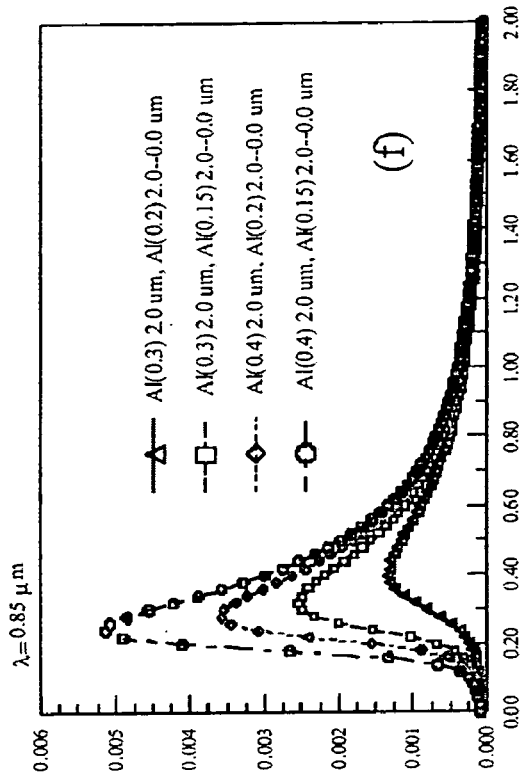
Figure 9C:
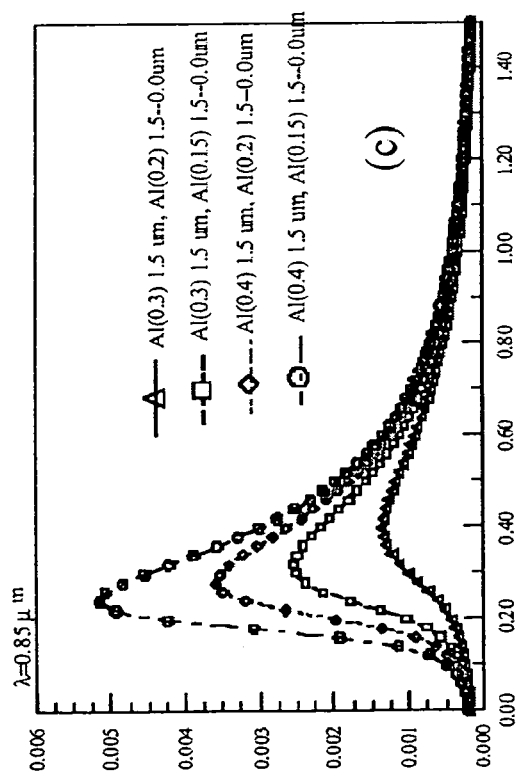

The variation of optical confinement with the waveguide layer thickness for $d_2$ of 1.5 μM is shown in FIGS. 9(a)–(c) where (a), (b), and (c) are the confinement factors for the waveguide core, cladding layer, and air, respectively. From these figures, it is clear that there is a strong dependence of the optical confinement in each layer on the waveguide layer thickness. As shown in FIG. 9(a), a significant increase in confinement occurs when $d_3$ is increased. As $d_3$ becomes larger, the light is confined more into the waveguide core and more of the total intensity is within the core layer. When layer 3 is thicker than ~0.6 μm to 0.8 μm, a majority of the mode power is within layer 3. In addition, the refractive index difference between layers 2 and 3 has a strong effect on the confinement factor. The greater the index difference, the greater the confinement factor. For example, an index difference Δn is 0.15 for x=0.4 (layer 2) and y= 0.15 (layer 3), while Δn is 0.06 for x=0.3 and y=0.2. Therefore, the confinement factor of the former case is larger than that of the latter case. This is because the guided optical power is increased with the index difference between the waveguide core and cladding layers. Unlike the waveguide core layer, the optical confinement in the cladding layer (layer 2) is considerably reduced with $d_3$, as shown in FIG. 9(b). If layer 3 is very thin, most of the optical power is spread into the AlGaAs cladding layer (layer 2). In FIG. 5(c), the confinement factor for layer 4 (the air region) is shown as a function of $d_3$. Since the grating coupling coefficient is proportional to the product of the field intensity at the grating and the index difference between layers 3 and 4, it is expected that the most optical coupling to the external waveguide occurs when the confinement factor of layer 4 is near a maximum.

FIGS. 9(d)–(f) show the confinement factor for the cladding layer thickness $d_2$ of 2 µm.

The confinement factor shows a trend similar to the case of $d_2$ of 1.5 µm. As $d_3$ increases, the confinement in layer 3 is considerably increased and rapidly saturated with a small value of $d_3$ (FIG. 9(d)). When compared to FIG. 9(a), the confinement factor in layer 3 for large $d_2$ (2 µm) is a little bit larger than that for $d_2$ of 1.5 µm. In contrast, the optical confinement in layer 2 is significantly reduced with $d_3$, as shown in FIG. 9(d). This is because as $d_3$ increases, more of the light intensity is confined to layer 3.

From the solutions of the wave equations, the effective refractive index of an asymmetric waveguide structure can be obtained by considering the propagation constant in the waveguide.

Figure 10A:
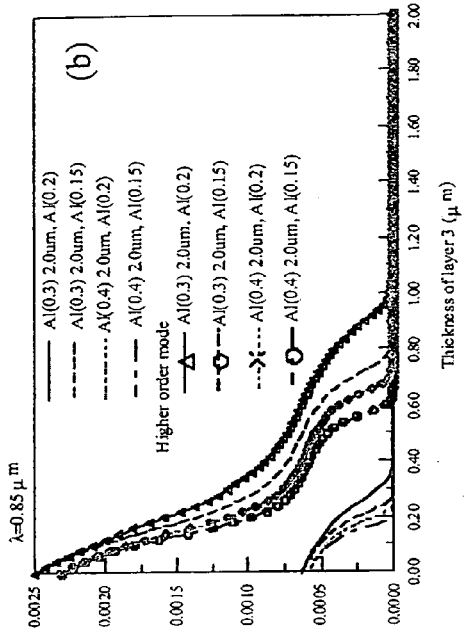
FIGS. 10(a) to 10(d) show the effective refractive index of the asymmetric waveguide which is shown in FIG. 8(a) as a function of layer 3, in accordance with the present invention.
Figure 10B:
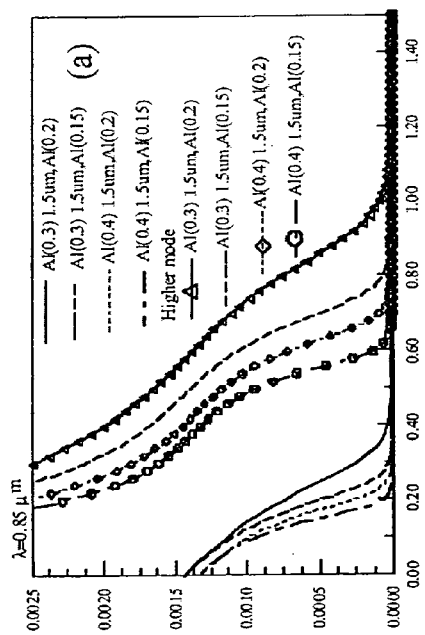

The effective refractive index is calculated by the ratio of the wave propagation constant in the waveguide to the free space wave number. This effective index can be complex depending on the parameters of the waveguide structure. FIGS. 10(a) to 10(d) show the effective refractive index of the asymmetric waveguide which is shown in FIG. 8(a) as a function of layer 3, with Al compositions fixed to 0.3 and 0.4 for layer 2 and 0.15 and 0.2 for layer 3. In FIGS. 10(a) and (b), the loss in the waveguide, which can be related to the imaginary part of the effective index, is illustrated for $d_2$ of 1.5 µm and 2 µm, respectively. The non-zero values of loss indicate that the optical mode power decays exponentially as the wave propagates in the waveguide and therefore the optical mode is cut-off. If the thickness of layer 3 is too small, then there will be no bound modes. The cut-off thickness of layer 3 for the fundamental $TE_0$ mode ranges from ~0.2 µm to 0.4 µm depending on the compositions of layers 2 and 3. Alternatively, if the thickness of layer 3 is greater than ~0.6 µm to 1 µm, a higher-mode $TE_1$ mode will appear. As shown in FIGS. 10(a) and (b), there is a thickness range over which this asymmetric waveguide will operate as a singlemode waveguide.

Figure 10C:
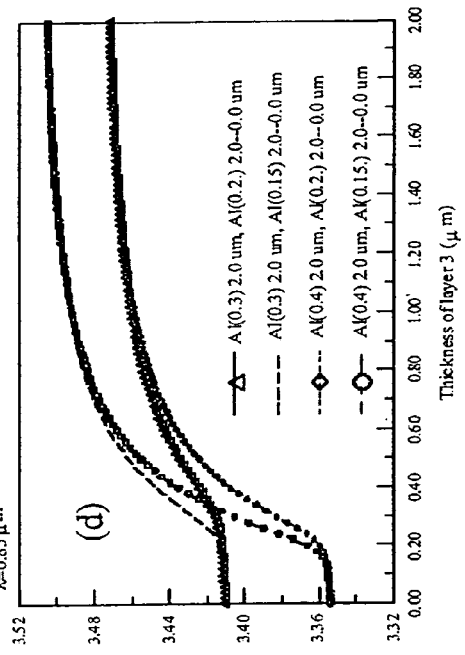
Figure 10D:
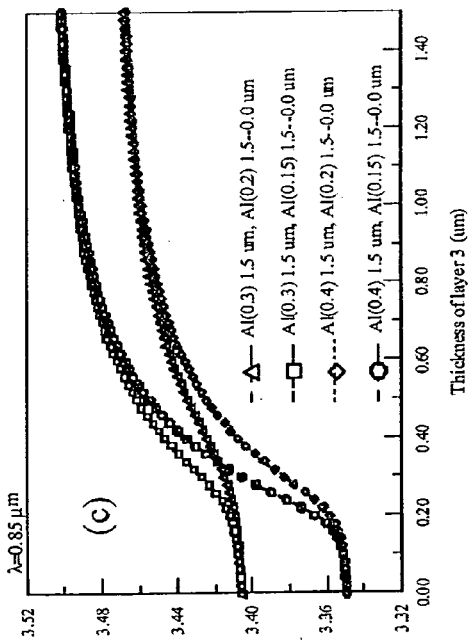

In FIGS. 10(c) and (d), the real part of the effective refractive index, $\eta_{eff}$ shown as a function of the thickness of layer 3 for $d_2$ of 1.5 µm and 2 µm, respectively. Only the index values for the fundamental waveguide mode $TE_0$ are shown. The real part of the effective index was used in the calculation of the grating period. The grating period Λ was chosen to be $Λ=λ_0/\eta_{eff}$ where $λ_o$ is the free space wavelength of the incident light.

From the theoretically calculated results for an asymmetric waveguide, the strongest grating confinement and hence a large optical coupling can be achieved with an asymmetric waveguide with a layer 3 Al mole fraction of 0.15 and a layer 2 Al mole fraction of 0.4. The thickness of the waveguide core layer is then determined mainly by the requirements of optical modal properties such as singlemode or multimode operation. First the design of a singlemode asymmetric waveguide will be considered with an optimum grating parameters to achieve high coupling efficiency.

Figure 11:
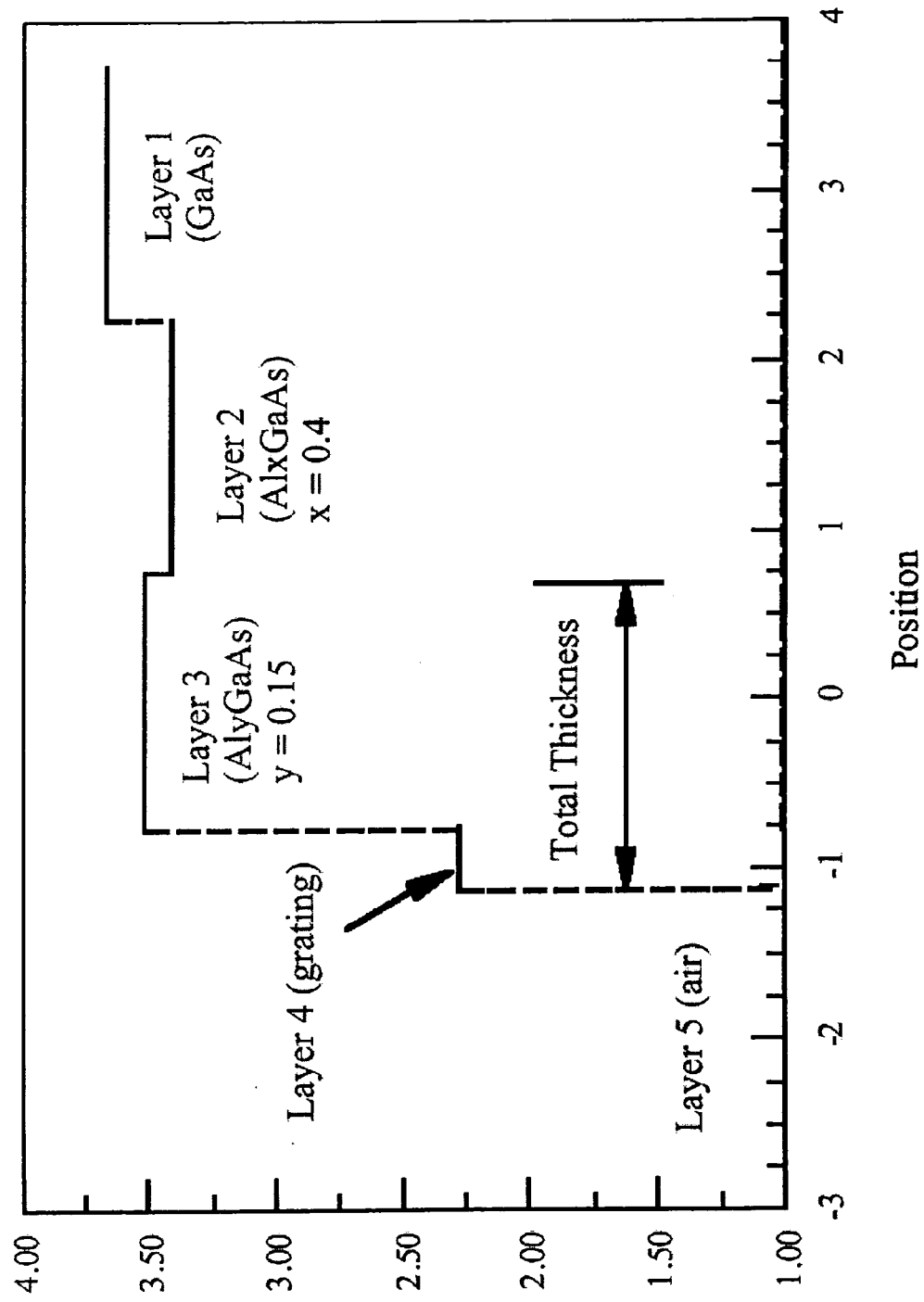
FIG. 11 illustrates the refractive index profile of a five-layer asymmetric waveguide, in which Al compositions are fixed to 0.4 and 0.15 for layers 2 and 3, respectively, in accordance with the present invention.

When a grating is etched into the asymmetric waveguide which is shown in FIG. 8(a), there will be a grating layer at the interfaces between the high index waveguide core and air. The grating layer is treated as a fifth layer. Therefore, the complete waveguide is composed of the GaAs substrate, an AlGaAs cladding layer, an AlGaAs waveguide core layer, a grating layer, and air. FIG. 11 shows the refractive index profile of this structure at 0.85 µm, with Al compositions are fixed to 0.4 and 0.15 for layers 2 and 3, respectively. The refractive index of the grating layer is given by the geometric mean of the indices of the waveguide core and air. Since the grating is etched into layer 3, the thickness of layer 3 decreases as the thickness of the grating layer increases. The sum of the thicknesses of the grating layer and layer 3 is a constant and is referred to as the "total thickness".

Figure 12:
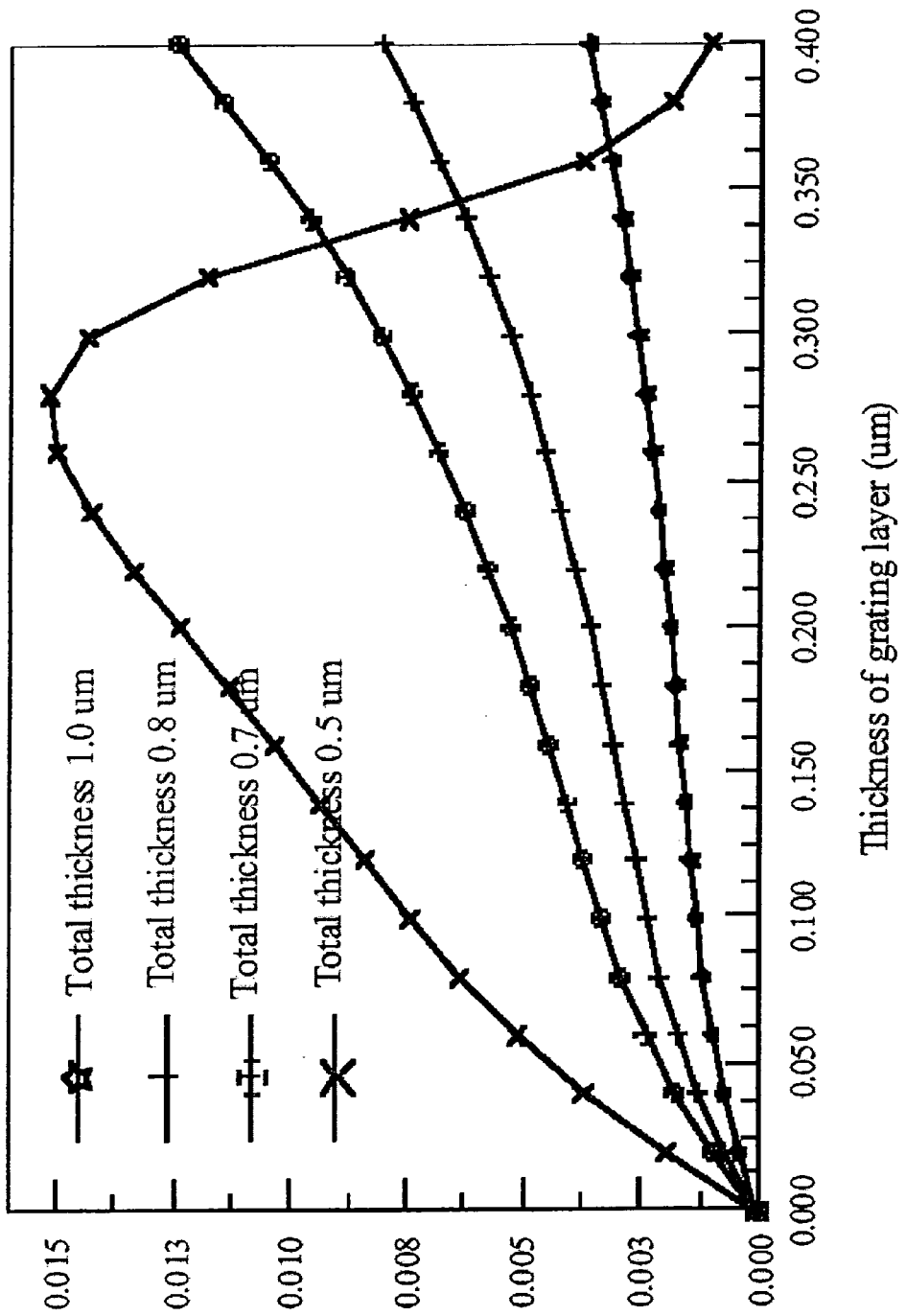
FIG. 12 is a plot of the grating confinement factor as a function of the thickness of the grating layer for an Al mole fraction of 0.15 in layer 3 and 0.4 in layer 2, in accordance with the present invention.

FIG. 12 is a plot of the grating confinement factor as a function of the thickness of the grating layer for an Al mole fraction of 0.15 in layer 3 and 0.4 in layer 2. The total thickness of the grating layer and layer 3 ranges from 0.5 µm to 1 µm. From this figure, it is clear that the grating confinement factor increases substantially as the total thickness is reduced. However, for the total thickness of 0.5 µm, there is an optimum range for the grating thickness. In this case, the maximum grating confinement factor of 0.015 can be achieved at the total thickness of ~0.28 µm. Since the coupling efficiency is directly proportional to the grating confinement factor, the maximum coupling occurs at this peak.

Figure 13:
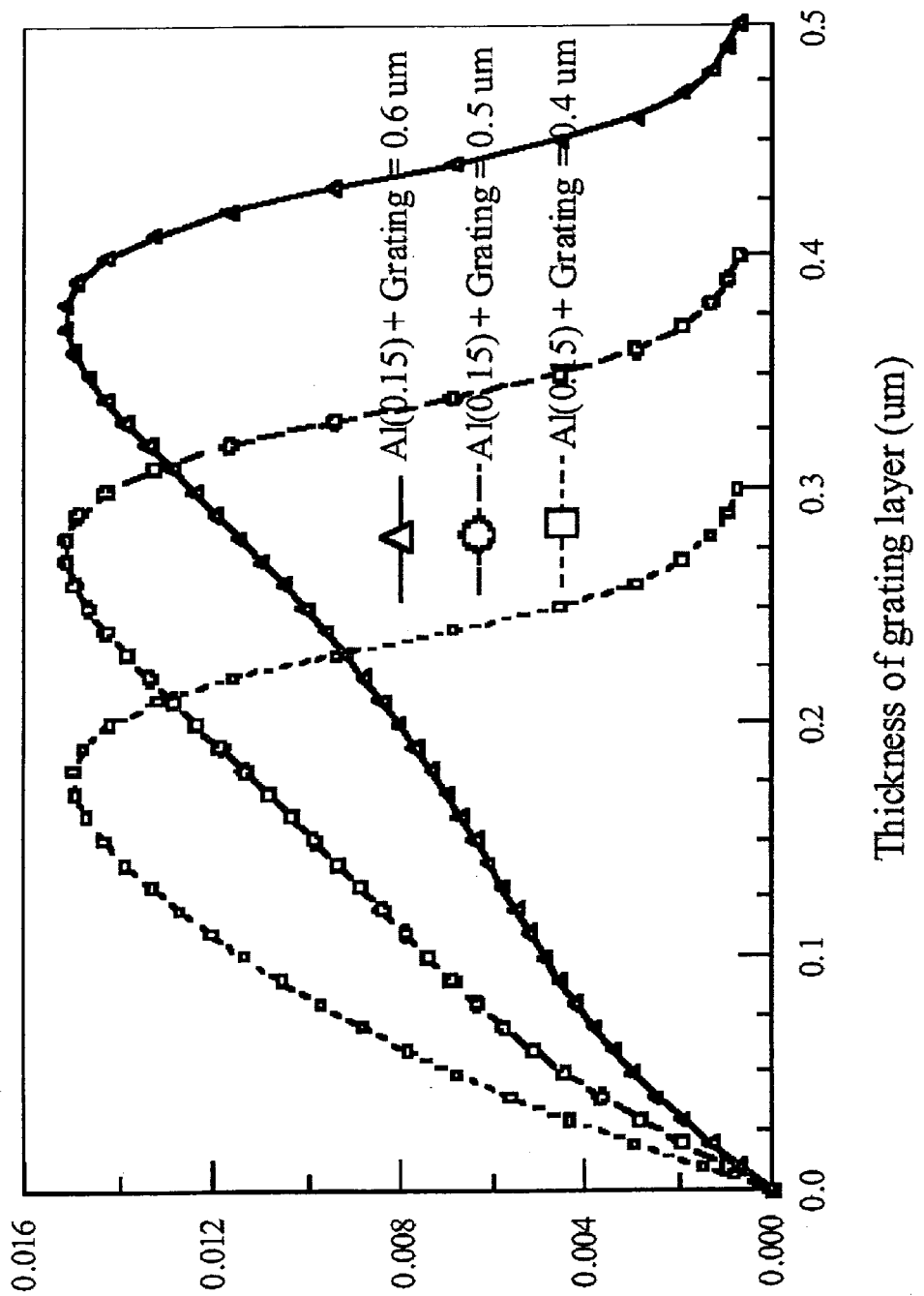
FIG. 13 exhibits the calculated results of the optimized asymmetric waveguide structure for singlemode operation at 0.85 $\mu$m, for Al mole fractions of layers 2 and 3 of 0.4 and 0.15, respectively, in accordance with the present invention.

FIG. 13 exhibits the calculated results of the optimized asymmetric waveguide structure for singlemode operation at 0.85 µm. Al mole fractions of layers 2 and 3 are assumed to be 0.4 and 0.15, respectively. The grating confinement factor is shown as a function of the grating depth for various total thicknesses of layer 3. The grating confinement factor for each case has a similar dependence on the grating depth. The optimum grating depth that results in the maximum coupling increases with the total thickness.

Figure 14B:
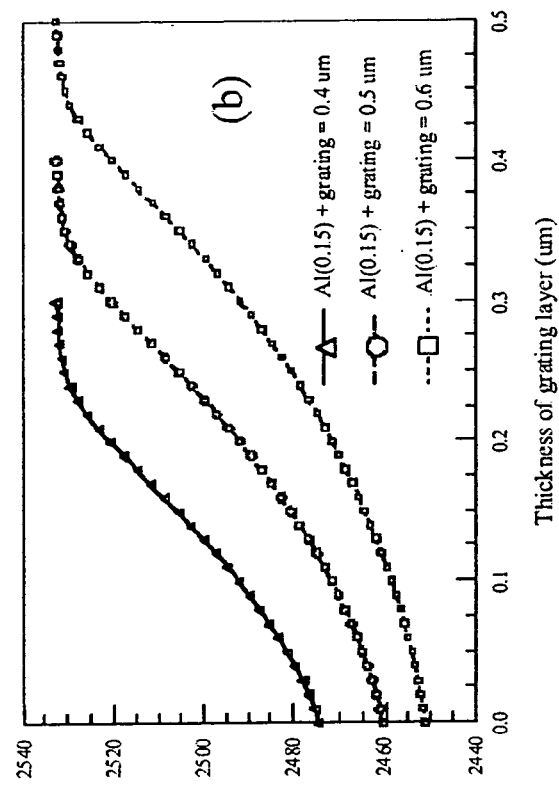
FIGS. 14(a) and 14(b) provide a plot of the real part of the effective refractive index, FIG. 14(a), and the grating period, FIG. 14(b), of the optimized waveguide versus the grating depth, in accordance with the present invention.
Figure 14A:
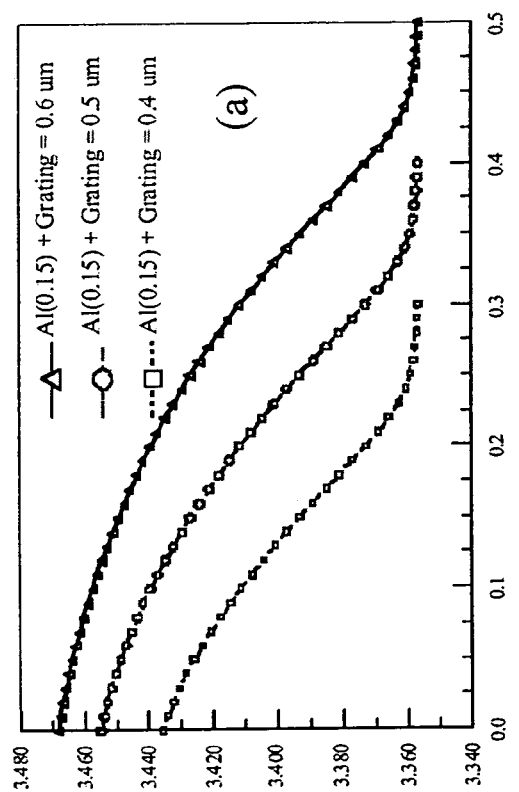

In FIGS. 14(a) and 14(b), the real part of the effective refractive index, FIG. 14(a), and the grating period, FIG. 14(b), of the optimized waveguide are plotted versus the grating depth. The optimized asymmetric waveguide used an Al mole fraction of 0.4 for layer 2 and an Al mole fraction of 0.15 for layer 3. The grating period was calculated using the real part of the effective index, as described previously. Since the real part of the effective index is reduced with the grating depth, the grating period is increased with the grating depth (grating period is inversely proportional to the real part of the effective index). For the total thickness of 0.5 µm, the grating period is ~0.251 µm.

Figure 15:
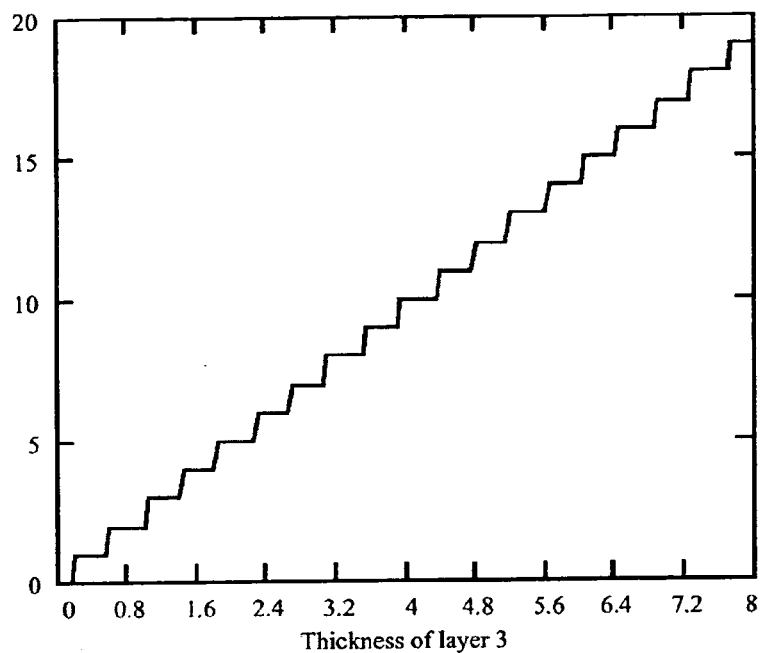
FIG. 15 shows the number of TE modes in the asymmetric waveguide versus $d_3$ for respective Al mole fractions of 0.4 and 0.15 for layers 2 and 3, in accordance with the present invention.

A multimode asymmetric waveguide grating coupler was also designed for a laser emission wavelength of 850 nm. The number of optical modes in the waveguide depends on both the thick-ness and the index difference between the waveguide and cladding layers. The number of modes can be approximately calculated from the following equation:

$$m = \frac{1}{\pi}\left[k_o d_3 \sqrt{n_3^2 - n_2^2} - \tan^{-1}\left(\frac{\sqrt{n_3^2 - n_4^2}}{\sqrt{n_3^2 - n_2^2}}\right)\right] \quad (2)$$

where $k_o$ is the free space wave number and $n_i$ is the refractive index of layer i. This equation was derived by assuming a three-layer asymmetric waveguide which consists of the cladding layer (layer 2), the waveguide core (layer 3), and the air (layer 4). From FIGS. 9(a) to 9(f), it can be deduced that the field intensity is negligibly small in the GaAs substrate since a majority of the light is confined in layers 2 and 3. As a result, the GaAs substrate can be neglected. FIG. 15 shows the number of TE modes in the asymmetric waveguide versus $d_3$ for respective Al mole fractions of 0.4 and 0.15 for layers 2 and 3. Singlemode operation can be achieved over the ranges between ~0.17 µm and 0.59 μm. It is expected from Equation 2 that as the thickness of layer 3 increases, the number of modes in the waveguide increases. For example, there are 19 TE modes in the asymmetric waveguide if layer 3 is 8 μm thick.

Figure 16:
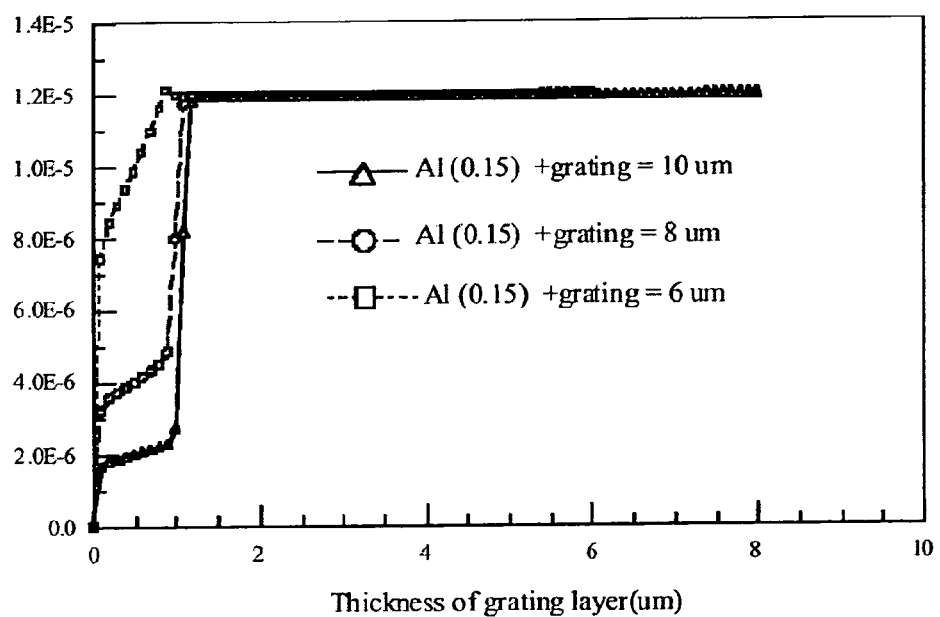
FIG. 16 illustrates the calculated results for a multimode asymmetric waveguide grating coupler for different total thickness of layer 3: 6 $\mu$m, 8 $\mu$m, and 10 $\mu$m, in accordance with the present invention.

In FIG. 16, the calculated results for a multimode asymmetric waveguide grating coupler is illustrated for different total thickness of layer 3: 6 μm, 8 μm, and 10 μm. The grating confinement factor is shown as a function of the grating depth for a multimode asymmetric waveguide with a mole fraction of 0.15 in layer 3 and a mole fraction of 0.4 in layer 2. The total thickness of layer 3 and the grating layer is fixed for each curve. The confinement factor increases initially with the grating depth, but it is saturated rapidly at the grating depth of ~1 μm. Therefore, the grating depth of >1 μm does not further increase the optical confinement in the grating region. As the mode order increases with total thickness, more of the light intensity is confined to layers 2 and 3. Therefore, the lower the mode order, the greater the confinement factor. When compared to a singlemode waveguide structure, the confinement factor for the multimode waveguide is much smaller.

Figure 17B:
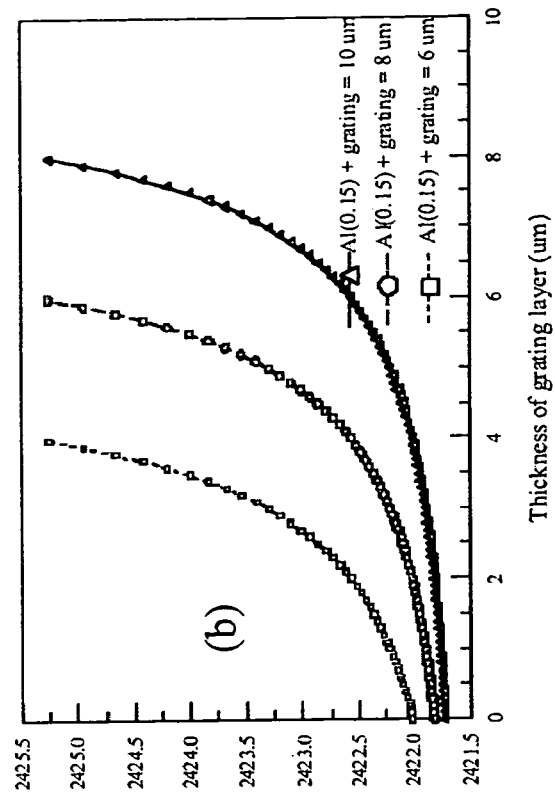
FIGS. 17(a) and 17(b) show the real part of the effective index as a function of the grating depth, and the grating period plotted versus the grating depth for different total thicknesses, respectively.
Figure 17A:
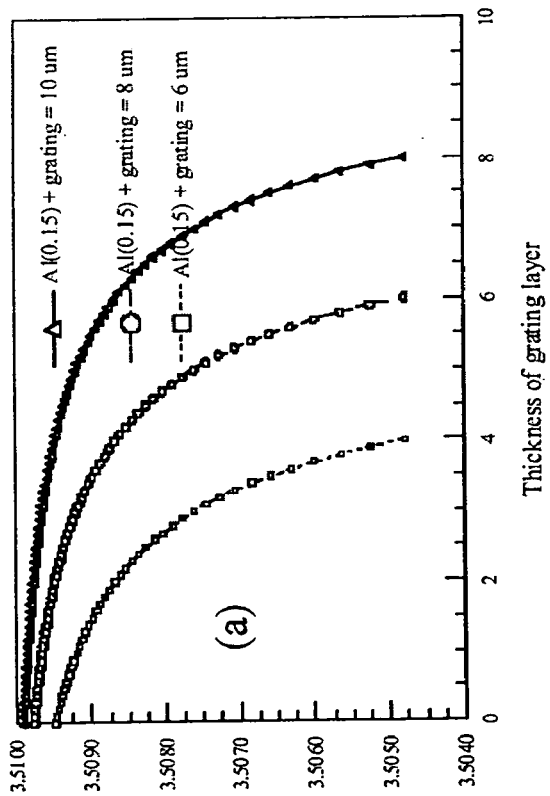

From the propagation constant in the waveguide, the effective refractive index was calculated. FIG. 17(a) shows the real part of the effective index as a function of the grating depth. The total thickness of layer 3 and grating layer is fixed for each curve: 6 μm, 8 μm, and 10 μm. In FIG. 17(b), the grating period is plotted versus the grating depth for different total thicknesses. The grating period was calculated from the real part of the effective index.

Scattering Characteristics of Waveguide Grating

Figure 18:
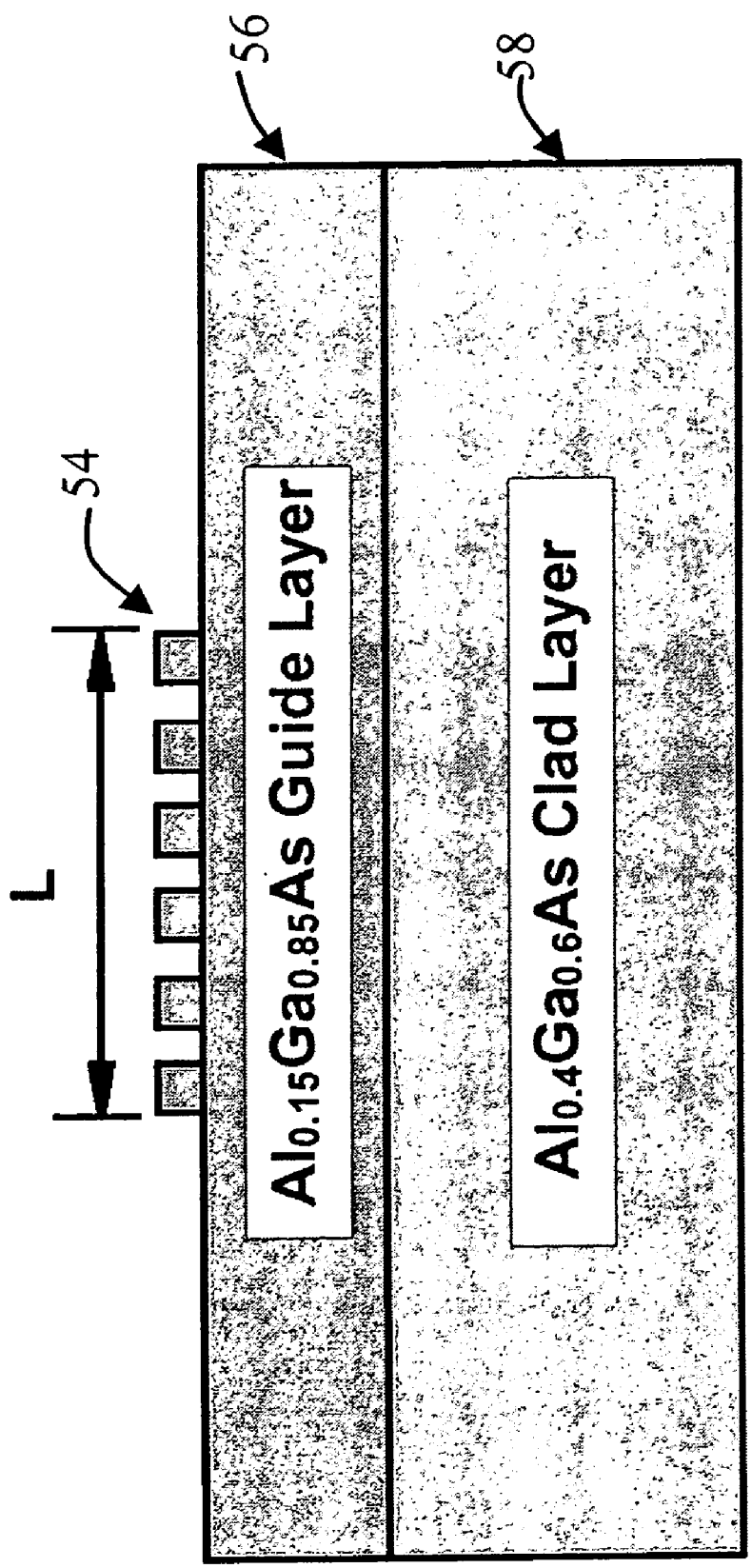
FIG. 18 is as simplified illustration of an asymmetric waveguide structure with gratings, in accordance with the present invention.

A schematic diagram of the waveguide grating coupler structure of the present invention is shown in FIG. 18. The waveguide has a finite-length grating that is etched onto an AlGaAs guide layer with an Al mole fraction of 0.15. The optical modes propagating from left to right are designed so that a majority of the optical power is confined to the guide layer. Since the waveguide is highly asymmetrical, in terms of the refractive index values of the layers surrounding the guide layer, much of the modal power will reside in the guide layer. In fact, the fraction of modal power that "feels" the grating will be small because of "leakage" to the cladding layer. It was assumed that an optical mode propagates from left to right. When the mode reaches the grating region, some power will be scattered at the interface of the "ungrated waveguide" and the "grated waveguide". The calculations which follow neglect the interface discontinuities because the scattered power can be minimized by proper design of the grated and ungrated waveguides.

The objective of the present invention is to couple light between the optical guide layer and a surface emitting laser that is just above the grating region of FIG. 18. Conversely, light from the surface emitting laser can be coupled to the guide layer. Accordingly, the light from the laser and the waveguide will couple in a unique fashion. In order to analyze the combination, it is only necessary to determine the scattering characteristics of the finite section of the grated waveguide. To couple several sources, the "unit cell" shown in FIG. 14 can be extended along the lateral direction. Analysis can be satisfactorily obtained from the scattering matrix of the unit cell.

The cross-section of the waveguide shows that grating 56 is etched onto the main guide layer 56 that is surrounded by cladding layer 58 below and an air layer above. The guide layer 56 has a refractive index value of n=3.5101468 while the cladding layer 58 has n=3.3601311. All refractive index values are for a free-space wavelength λ=0.85 μm. The cladding layer 58 has a thickness of 0.4 μm while the guide layer 56 thickness is 0.4 μm and the grating depth is 0.1 μm. It is assumed that the total thickness of the grating and waveguide layer is 0.5 μm.

Figure 19:
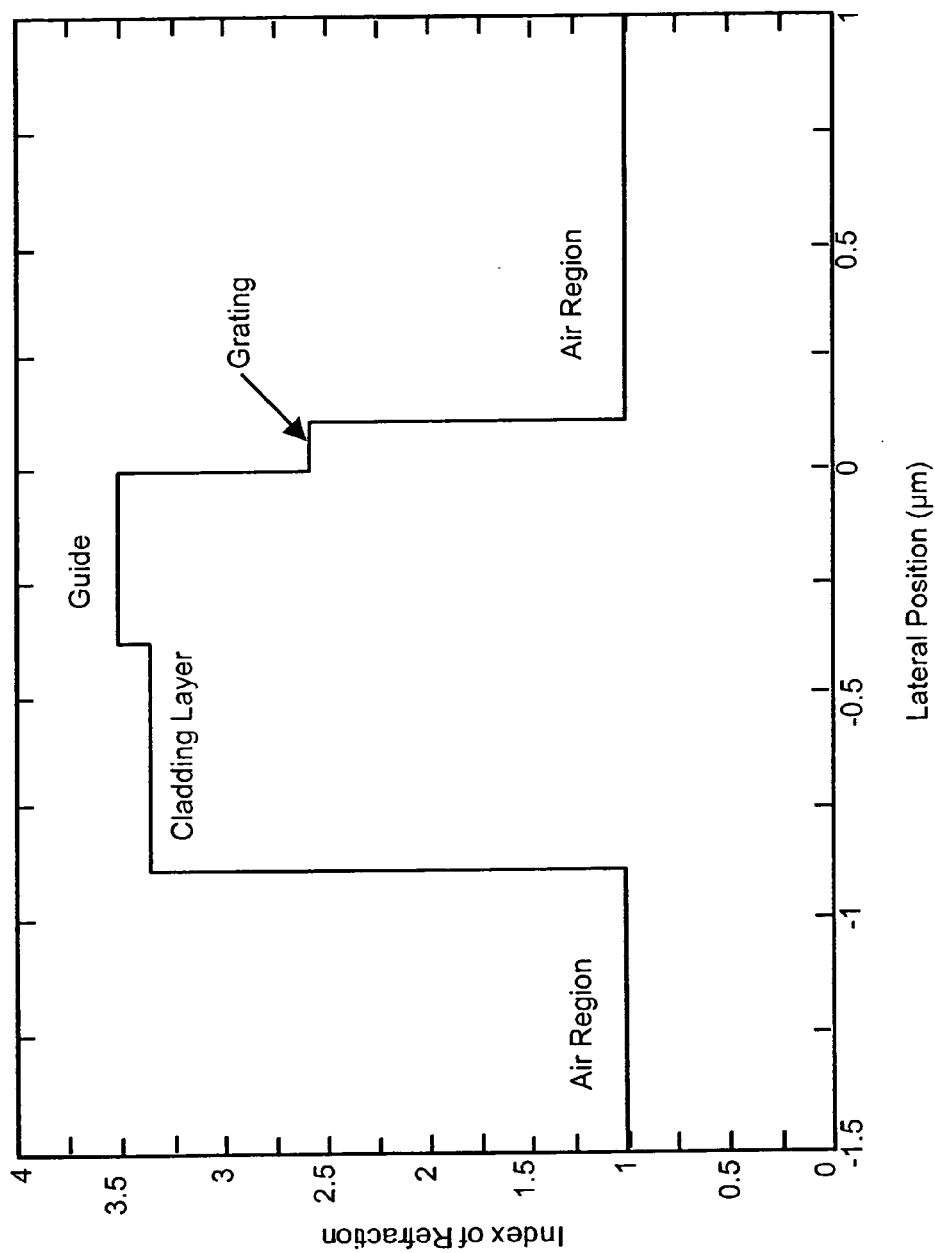
FIG. 19 illustrates the refractive index profile of the asymmetric waveguide shown in FIG. 18, in accordance with the present invention.

The refractive index profile of the asymmetric waveguide shown in FIG. 18 is illustrated in FIG. 19. The grating starts at x=0 and extends to x=the grating depth. The figure shows that the index of refraction of the grating regions has a value of ~2.5. This value is obtained by taking the average of the refractive index of the material of the guide layer and that of air. This estimated value of the index can be used to approximate the axial propagation constant of the Floquet-Bloch mode propagating the dielectric region of the structure.

Figure 20:
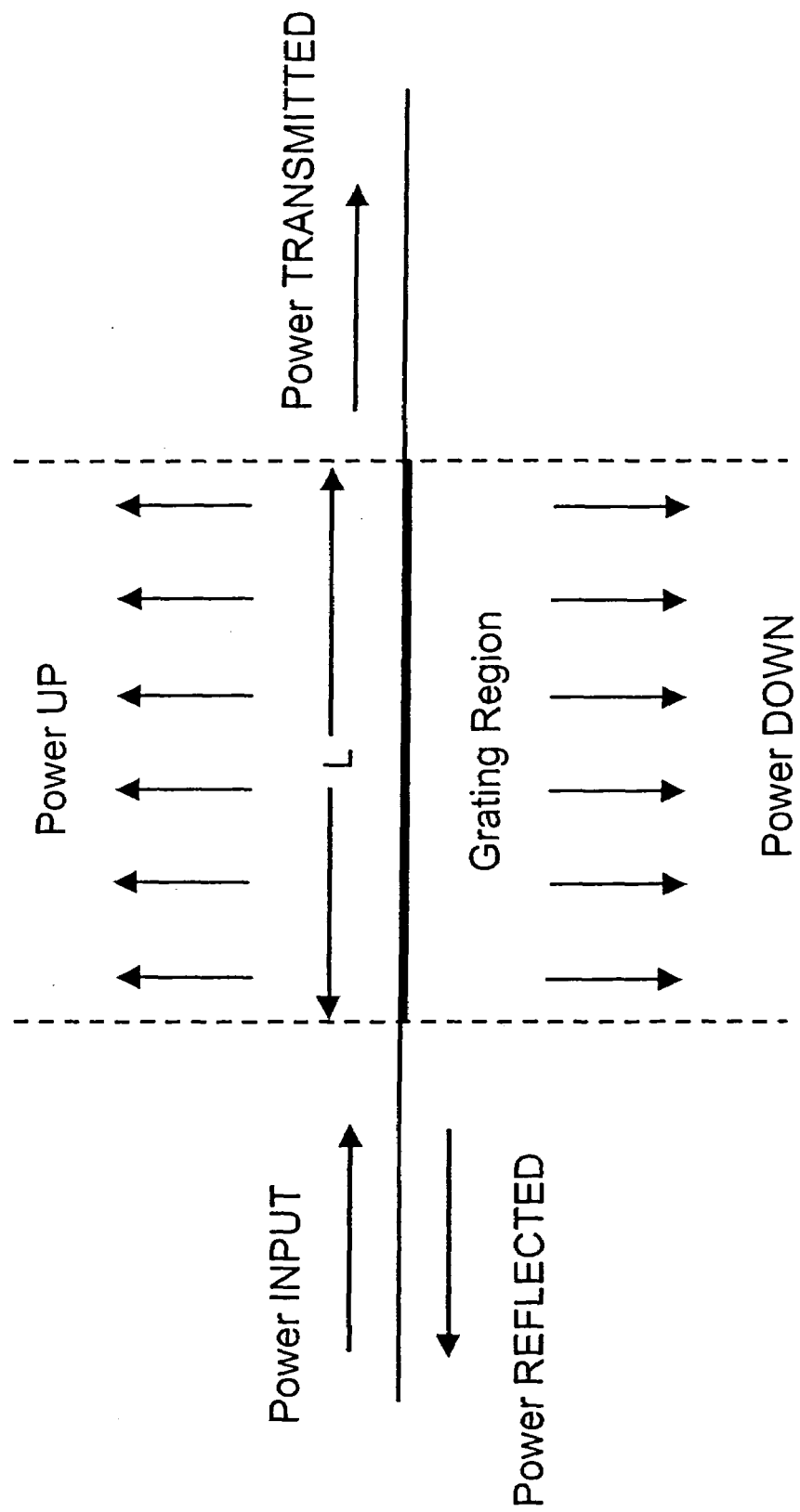
FIG. 20 provides circuit model which can be used to analyze the waveguide section of FIG. 18, in accordance with the present invention.

The waveguide section of FIG. 18 can be analyzed using the circuit model which is shown in FIG. 20. Note that optical power will be directed from the left waveguide. As light propagates in the grating, there will be power scattered in four directions:

(a) the grating will scatter light into air above the grating
(b) light will scatter below the grating into air
(c) light will be reflected backward
(d) light will be transmitted to the waveguide to the right side of the grating.

The powers radiated in the up and down directions are computed using Poynting vectors. The up and down powers are computed by integrating the upward (or downward) component of the Poynting vector over the grating length L. Only the fast-wave space harmonics around the second Bragg are needed for the radiated power calculation.

Figure 21:
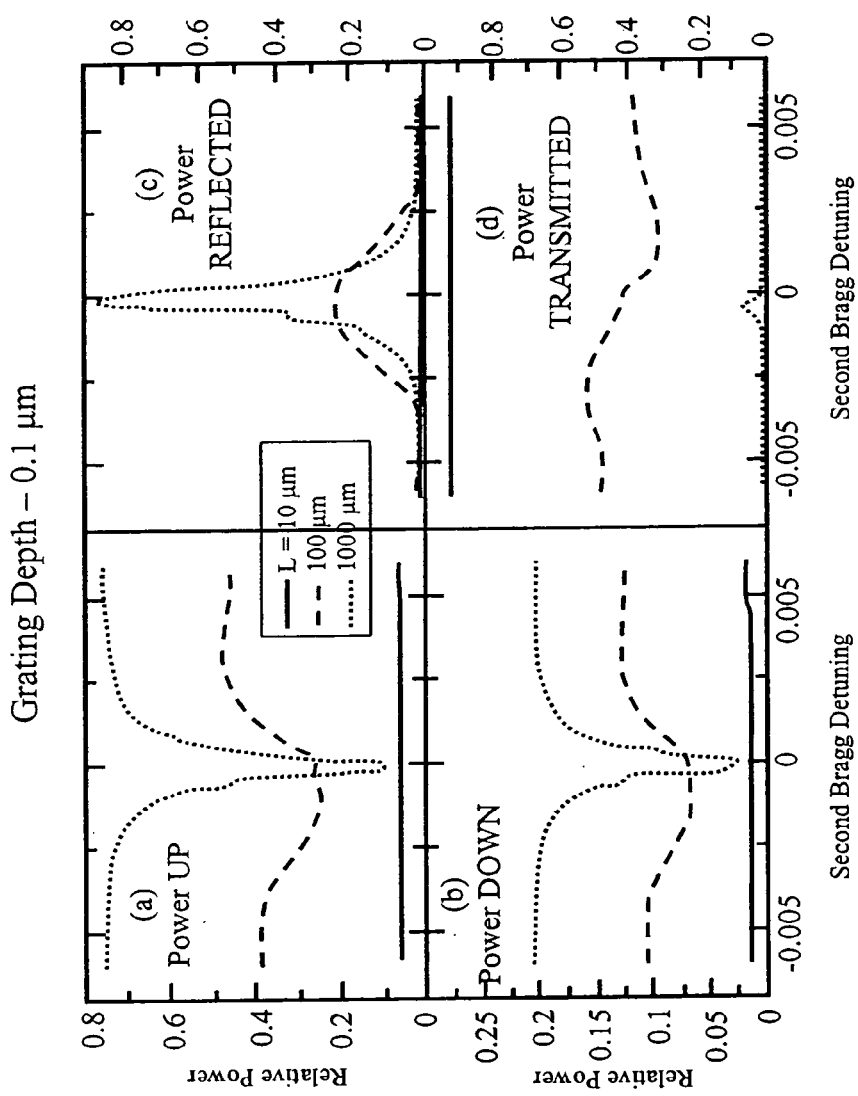
FIGS. 21(a) to 21(d) illustrate the scattered powers of the grating region of FIG. 18, in accordance with the present invention.

The scattered powers are shown in FIG. 21. The grating depth is 0.1 μm while the waveguide and cladding layer thickness are 0.4 μm. The second Bragg detuning parameter is equivalent to sin θ, where θ characterizes the direction of radiation relative to the normal of the waveguide. For example, when the Bragg detuning parameter is 0.005, the radiation will be directed at θ=0.005 rad. This is because sin θ is approximately θ. The waveguide whose length L=10 μm exhibits very little dispersion about the second Bragg. ~8% of the input power is radiated in the upward direction, while 2% is lost to the region below the guide. The grating of length L=10 μm produces very little reflected power, while the transmitted power is ~90%. Because of the reciprocity condition, light from a source above the grating will couple ~8% into one direction in the waveguide. This corresponds to ~16% total (left and right directions.).

Figure 22:
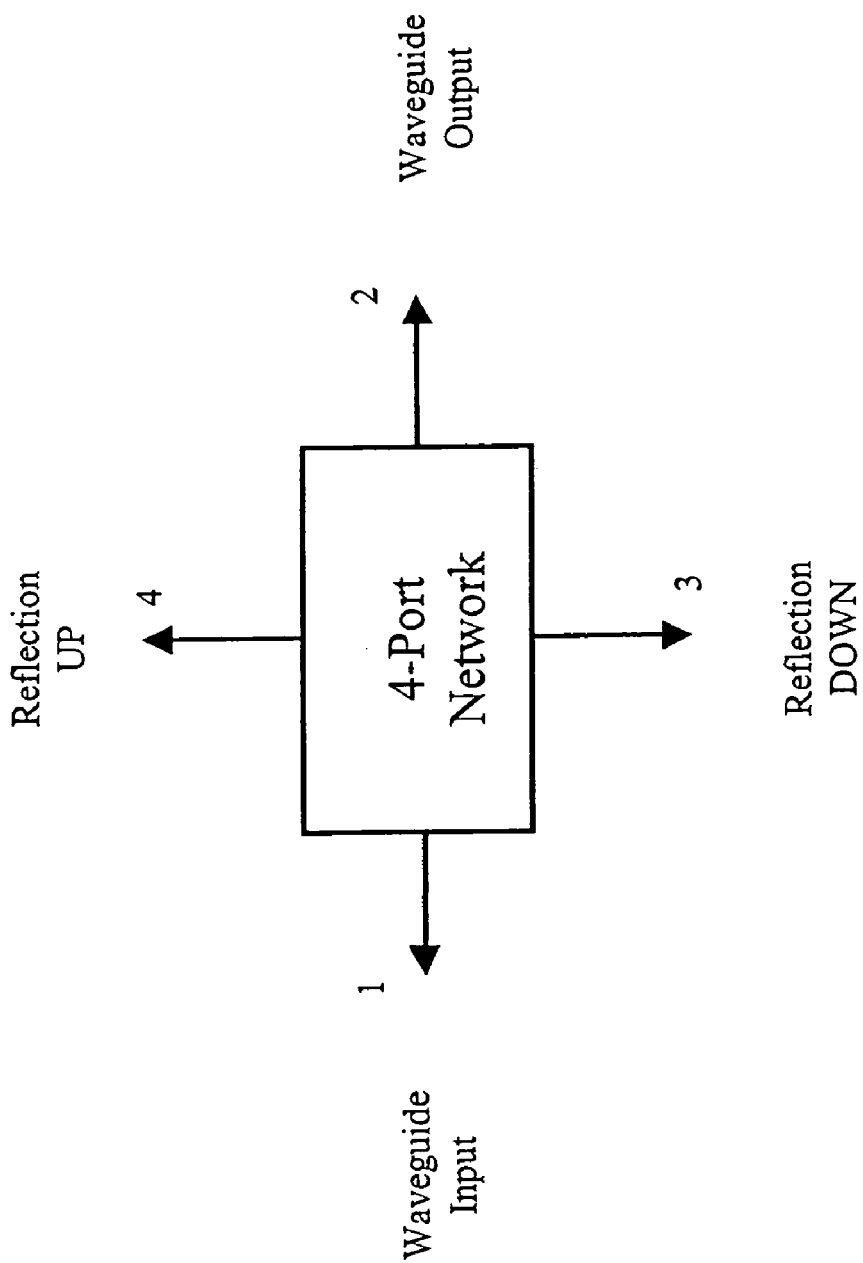
FIG. 22 illustrates the use of a four port network model to characterize the grating region, in accordance with the present invention.

Because the grating acts as a four port network, the grating region can be characterized as a four port network as shown in FIG. 22. The circuit model of the single scattering section can be used to model the performance of a group of cascaded elements. Four-port network can be characterized with its scattering matrix:

$$S = \begin{bmatrix} S_{11} S_{12} S_{13} S_{14} \\ S_{21} S_{22} S_{23} S_{24} \\ S_{31} S_{32} S_{33} S_{34} \\ S_{41} S_{42} S_{43} S_{44} \end{bmatrix} \quad (3)$$

Assuming input is from port 1, $S_{11}$ represents the reflection coefficient, S 12 represents the transmission coefficients to the second port, etc. If the port is lossless, then Sij=S*ji, where * is the complex conjugate. Because of the symmetry conditions between ports 1 and 2, all scattering elements can be found. The magnitude of the reflection coefficient $S_{11}$ is the square root of the reflected power (FIG. 21(c)), while the magnitude of the transmission coefficient $S_{12}$ is the square root of the transmitted power (FIG. 21(d)). Similarly, the magnitude of the transmission coefficients $S_{14}$ and $S_{13}$ are determined from transmitted powers (square roots) shown in FIGS. 21(a) and (b), respectively. Although phases of the scattering matrix elements are not shown, their values play key roles in determining the performance of the cascaded circuits.

High-power coherent light sources can be achieved by using a VCSEL/waveguide structure.

The surface-normal grating coupler is employed to achieve the desired coupling light from the VCSEL into a single common waveguide for phase locking. Three architectures have been proposed to integrate the grating-coupled waveguide with the VCSEL array. These architectures can be utilized to fabricate low-cost, high-power coherent light sources for a variety of military and commercial applications.

The present invention has been described above with reference to a grating coupling embodiment. However, those skilled in the art will recognize that changes and modifications may be made in the above described embodiments without departing from the scope of the invention. Furthermore, while the present invention has been described in connection with a specific processing flow, those skilled in the are will recognize that a large amount of variation in configuring the processing tasks and in sequencing the processing tasks may be directed to accomplishing substantially the same functions as are described herein. These and other changes and modifications which are obvious to those skilled in the art in view of what has been described herein are intended to be included within the scope of the present invention.

What is claimed is:

1. A coherent optical source comprising:
   a plurality of Vertical Cavity Surface Emitting Lasers (VCSELs); and
   a beam splitting structure which optically couples emissions of the plurality of VCSELs between the plurality of VCSELs to cause a coherent mode locking condition to occur in the plurality of VCSELs.

2. A coherent optical source comprising:
   a plurality of Vertical Cavity Surface Emitting Lasers (VCSELs); and
   a beam cube to couple a reference beam to the plurality of VCSELs and which optically couples emissions of the plurality of VCSELs between the plurality of VCSELs to cause a coherent mode locking condition to occur in the plurality of VCSELs.

3. A coherent optical source comprising:
   a plurality of Vertical Cavity Surface Emitting Lasers (VCSELs); and
   a waveguide which optically couples emissions of the plurality of VCSELs between the plurality of VCSELs by a predetermined amount of coupling strength sufficient to cause a coherent mode locking condition to occur in the plurality of VCSELs.

4. A coherent optical source comprising
   a reference source of light;
   a plurality of Vertical Cavity Surface Emitting Lasers (VCSELs); and
   a beam cube positioned to couple light from the reference source into the plurality of VCSELs with a vertically dependent phase and to provide a predetermined amount of coupling strength between the plurality of VCSELs sufficient to cause a coherent mode locking condition to occur.

5. The coherent optical source of claim 4, wherein the light from the reference source which is coupled by the beam cube to the plurality of VCSELs has a phase difference between ones of the plurality of VCSELs which is substantially equal to an integer multiple of $2\pi$ radians.

6. The coherent optical source of claim 4, wherein the beam cube is capable of being rotated so that the light from the reference source which is coupled by the beam cube to the plurality of VCSELs has a phase difference between ones of the plurality of VCSELs which is substantially equal to an integer multiple of $2\pi$ radians.

7. The optical coherent source of claim 4 wherein a time domain adjustment is provided by the beam cube to cause a coherent mode locking condition to occur.

8. The optical coherent source of claim 7, wherein the phase of light traveling through the beam cube is adjusted in the beam cube to cause a coherent mode locking condition to occur.

9. The optical coherent source of claim 8, wherein the beam cube is implemented in the frequency domain with a waveguide having a surface grating shaped to provide a selected change in frequency of light transmitted through the surface grating.

10. The optical coherent source of claim 9, wherein the surface grating is etched in the waveguide.

11. The optical coherent source of claim 9, wherein the surface grating is implanted into the waveguide.

12. The optical coherent source of claim 9, wherein the surface grating is a periodic grating which is shaped to provide a frequency domain adjustment.

13. The coherent optical source of claim 12, further including a highly reflective mirror positioned on the waveguide substantially opposite the surface grating.

14. A coherent optical source comprising:
    a plurality of Vertical Cavity Surface Emitting Lasers (VCSELs); and
    a plurality of beam cubes, each of which is associated with a different one of the plurality of VCSELs, which optically couple emissions of the plurality of VCSELs between the plurality of VCSELs to cause a coherent mode locking condition to occur in the plurality of VCSELs.

15. A coherent optical source comprising
    a plurality of Vertical Cavity Surface Emitting Lasers (VCSELs); and
    a waveguide, having a surface grating, positioned to provide a predetermined amount of coupling strength between the plurality of VCSELs sufficient to cause a coherent mode locking condition to occur.

16. The coherent optical source of claim 15, wherein the surface grating period is such that part of output power from each of the plurality of VCSELs is coupled to the waveguide by the surface grating and part of the output power into coherently coupled to other VCSELs in the array, whereby all of the plurality of VCSELs become mutually coherent, and all of the VCSEL outputs can be coherently summed.

17. The coherent optical source of claim 16, wherein the plurality of VSCELs are formed in a first substrate; and the waveguide and surface grating are formed in a different substrate.

18. The coherent optical source of claim 17, further including collimating optics positioned between the surface grating and the plurality of VCSELs.

19. The coherent optical source of claim 15, wherein the plurality of VCSELs, the waveguide and the surface grating are fabricated in a monolithic structure on a single substrate.

20. The coherent optical source of claim 19, further including a mirror positioned on the waveguide substantially opposite the surface grating.

21. The coherent optical source of claim 19, wherein each of the VCSELs has at least a pair of mirrors and the waveguide and surface grating are placed within one of the pair of mirrors of each of the plurality of VCSEL.

22. The coherent optical source of claim 19, wherein the mirrors are distributed Bragg reflector (DBRs) mirrors.

23. The coherent optical source of claim 19, wherein a thickness of the waveguide is selected such that it functions as a high index layer of the DBR.

24. A coherent optical source comprising:
a plurality of VCSELs; and
a waveguide, having a plurality of gratings, which optically couples emissions of the plurality of VCSELs between the plurality of VCSELs to cause a coherent mode locking condition to occur in the plurality of VCSELs.

25. The coherent optical source of claim 24, wherein the plurality of gratings each correspond to particular VCSELs of the plurality of VCSELs.

\* \* \* \* \*